US011763888B1

(12) United States Patent
Pedretti et al.

(10) Patent No.: US 11,763,888 B1
(45) Date of Patent: Sep. 19, 2023

(54) RANGE SEGMENTING FOR ANALOG CAM WITH IMPROVED PRECISION

(71) Applicant: HEWLETT PACKARD ENTERPRISE DEVELOPMENT LP, Houston, TX (US)

(72) Inventors: Giacomo Pedretti, Cernusco sul Naviglio (IT); John Moon, Houston, TX (US); Pedro Henrique Rocha Bruel, Houston, TX (US); Catherine Graves, Milpitas, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 17/872,923

(22) Filed: Jul. 25, 2022

(51) Int. Cl.
*G11C 15/04* (2006.01)
*G11C 7/16* (2006.01)
*G11C 16/34* (2006.01)
*G11C 16/10* (2006.01)

(52) U.S. Cl.
CPC .............. *G11C 15/04* (2013.01); *G11C 7/16* (2013.01); *G11C 16/102* (2013.01); *G11C 16/3404* (2013.01)

(58) Field of Classification Search
CPC ......... G11C 15/04; G11C 7/16; G11C 16/102; G11C 16/3404
See application file for complete search history.

(56) References Cited

U.S. PATENT DOCUMENTS

| 6,985,372 B1 * | 1/2006 | Blyth .................... G11C 15/046 365/45 |
| 10,643,701 B2 * | 5/2020 | Ma .......................... G06F 12/00 |
| 2019/0221262 A1 * | 7/2019 | Ma ..................... G06F 18/24147 |
| 2020/0219547 A1 * | 7/2020 | Ma ....................... G11C 11/4125 |
| 2022/0375526 A1 * | 11/2022 | Tseng ................. G11C 16/0433 |

* cited by examiner

*Primary Examiner* — Jay W. Radke
(74) *Attorney, Agent, or Firm* — Sheppard Mullin Richter Hampton LLP

(57) ABSTRACT

Systems and methods provide new circuits that increase aCAM precision by leveraging the concept of range segmenting to representationally store an analog voltage range across multiple aCAM cells/sub-circuits (here the representationally stored analog voltage range may correspond to a word entry). In this way, a circuit of the presently disclosed technology can increase precision (e.g., the number of programmable levels that can be used to store a word entry and/or the number of programmable levels that an input signal can be search against) linearly with each aCAM cell/sub-circuit added to the circuit. Accordingly, circuits of the presently disclosed technology can be used to carry out more complex computations than conventional aCAMs—and thus can be used in a wider range of computational applications.

20 Claims, 11 Drawing Sheets

RANGE SEGMENTING FOR ANALOG CAM WITH IMPROVED PRECISION

BACKGROUND

Content addressable memory ("CAM") is a type of computing memory in which stored data is searched by its content rather than its location. When a "word" is input to a CAM, the CAM searches for the word in its contents. If the CAM finds the word (i.e., "returns a match"), the CAM returns the address of the location where the found word resides.

Analog CAMs ("aCAMs") are special types of CAMs that can store and search for ranges of values (in contrast to more traditional digital-based CAMs which can only store/search for zeros and ones) using the programmable conductance of memristors. For example, in a given aCAM cell, the conductance of a first memristor may be programmed to set the lower boundary of a range, and the conductance of a second memristor may be programmed to set an upper boundary of the range. The aCAM cell can perform a search to determine whether an input (e.g., an input analog voltage signal) falls within the programmed range defined by the conductance of the first and second memristors. If the input falls within the programmed range, the aCAM cell will return a match. If the input falls outside of the programmed range, the aCAM cell will return a mismatch.

Individual aCAM cells can be arranged into aCAM arrays consisting of rows and columns of aCAM cells. Words can be stored along the rows of the aCAM array (the rows of an aCAM array can be referred to as "match lines"), where each aCAM cell of a given row stores an entry of the stored word. When the aCAM array receives an input word (e.g., a series of analog voltage signals each representing an entry of the input word), the aCAM array can search for the input word, by entry, along the columns of the aCAM array (i.e., a first entry of the input word can be searched down a first column of the CAM array, a second entry of the input word can be searched down a second column of the CAM array, etc.). The aCAM array will "find" the input word in a given row if all the aCAM cells of the given row return a match for their respective entries of the input word.

BRIEF DESCRIPTION OF THE DRAWINGS

The present disclosure, in accordance with one or more various examples, is described in detail with reference to the following figures. The figures are provided for purposes of illustration only and merely depict examples.

DETAILED DESCRIPTION

Figure 1:
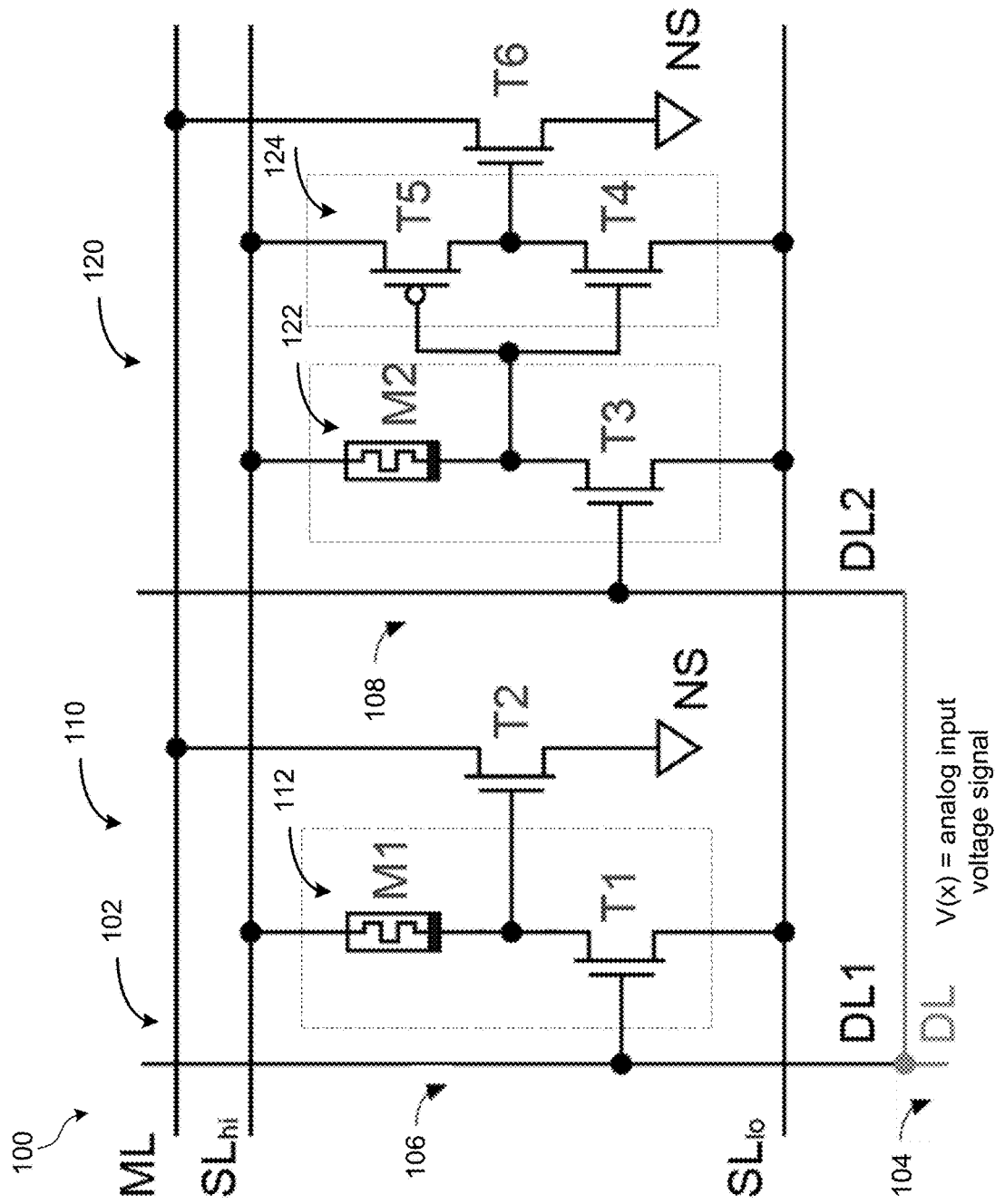
FIG. 1 depicts an example aCAM cell, in accordance with examples of the presently disclosed technology.

By natively performing searching/matching operations between an input word and internally stored words/patterns, an aCAM array can be used to carry out computations for various applications. At a high level, the more complex matching operations the aCAM array can perform, the more complex computations it can carry out.

The complexity of searching/matching operations an aCAM array can perform (and by extension the complexity of computations it can be used to carry out) is limited by the number of unique values that its constituent cells can store/search for. The number of unique values an aCAM cell can store/search for may be referred to as a number of programmable levels for the aCAM cell, or a level of precision for the aCAM cell. A high precision aCAM (i.e., an aCAM with a higher number of programmable levels) will be able to carry out more complex computations than a low precision aCAM (i.e., an aCAM with a lower number of programmable levels).

A significant limitation of aCAMs is that their precision is restricted by intrinsic structural limitations of their analog storage elements (i.e., conductance programmable memristors). In particular, due to intrinsic structural limitations/imperfections, memristors used in aCAMs can only be programmed to a finite/discrete number of conductance states (i.e., an M-bit memristor has $2^M$ discrete/finite programmable conductance states). For example, 2-bit memristors commonly used in aCAMs have 4 programmable conductance states (and 2 programmable bits). As described above, programmed conductances of two memristors can be used to set a lower and upper boundary of a stored range for an aCAM cell (here the stored range may represent an entry of a stored word). As a consequence of their limited programmability, memristors can only be used to set range boundaries in a finite/discrete manner. This means that a typical aCAM cell will have a discrete/finite number of programmable levels. For example, a typical aCAM cell utilizing two 2-bit memristors will only have $2^{M=2}=4$ programmable levels.

As alluded to above, due to their limited precision, conventional aCAMs have limited capacity to carry out computations requiring higher degrees of complexity—which has limited their practical applicability. In other words, conventional aCAMs have generally been unable to carry out complex computations that require searching an input against a high number of programmable levels (e.g., 16 levels, 32 levels, 64 levels, etc.).

Against this backdrop, examples of the presently disclosed technology provide new circuits that increase aCAM precision by leveraging the concept of range segmenting to representationally store an analog voltage range across multiple aCAM cells/sub-circuits (here the representationally stored analog voltage range may correspond to a word entry). In this way, a circuit of the presently disclosed technology can increase precision (e.g., the number of programmable levels that can be used to store a word entry and/or the number of programmable levels that an input signal can be search against) linearly with each aCAM cell/sub-circuit added to the circuit. Accordingly, circuits of the presently disclosed technology can be used to carry out more complex computations than conventional aCAMs—and thus can be used in a wider range of computational applications.

Through "range segmenting," examples can representationally store an analog voltage range across multiple aCAM cells/sub-circuits—where each aCAM cell/sub-circuit representationally stores a segment of the representationally stored analog voltage range. As will be described in greater detail below, such range segmenting may require strategic programming of lower and upper boundary thresholds for each aCAM cell/sub-circuit to ensure that the combination of aCAM cells/sub-circuits is able to representationally store an analogic voltage range that none of the aCAM cells/sub-circuits could store individually.

To complement the range segmenting/programming used to store an analog voltage range across multiple aCAM cells/sub-circuits, examples also employ strategic signal adjustments which allow a circuit to search a digital input signal (x) against the (large) analog voltage range representationally stored across the multiple aCAM cells/sub-circuits. Such signal adjustments may comprise providing a given aCAM cell/sub-circuit with a version of the digital input signal (x) reduced according to an aggregate number of programmable levels of the aCAM cells/sub-circuits that proceed it in an ordered representational level arrangement (as used herein, an ordered representational level arrangement may refer to an ordered logical arrangement of aCAM sub-circuits used to store representational levels for a circuit). As will be described below, such signal adjustment/reduction can be used to account for structural/programmability limitations of the individual aCAM cells/sub-circuits of the circuit. Namely, such signal adjustment allows the circuit to search received input signal values that exceed boundary setting programmability limits of the circuit's constituent aCAM cells/sub-circuits.

FIG. 1 depicts an example aCAM cell 100 that may be used to implement circuits of the presently disclosed technology. As described above, aCAM cell 100 can search an input signal (e.g., analog input voltage signal (V(x))) against a stored analog voltage range.

aCAM cell 100 includes a match line (i.e., ML 102) that may be pre-charged to a high voltage. As will be described below, aCAM cell 100 "returns a match" when the voltage across ML 102 remains high, and "returns a mismatch" when the voltage across ML 102 is discharged. As described above, in various examples aCAM cell 100 may be an aCAM cell in a row of an aCAM array. In certain examples, the match/mismatch result for the entire row (of which aCAM cell 100 is a part) may be output to another circuit (e.g., a resistive random access memory array) for further processing/classification.

aCAM cell 100 also includes two data lines: DL1 106 and DL2 108 (running vertically in the example of FIG. 1) that are both electrically connected to an input data line: DL 104. aCAM cell 100 may receive an analog input voltage signal (V(x)) along DL 104 (here, analog input voltage signal (V(x)) may be an analog voltage signal that was converted from a digital input signal (x)). As depicted, DL1 106 and DL2 108 are both electrically connected to DL 104, and are electrically connected in parallel with respect to each other. Accordingly, analog input voltage signal (V(x)) may be applied along DL1 106 and DL2 108 respectively. As alluded to above, analog input voltage signal (V(x)) will eventually discharge ML 102 if analog input voltage signal (V(x)) is outside of the analog voltage range programmed in aCAM cell 100. Here, the analog voltage range stored by aCAM cell 100 is set/defined by programmed conductances of memristors M1 and M2, where the programmed conductance of memristor M1 sets/defines the lower bound of the stored analog voltage range and the programmed conductance of memristor M2 sets/defines the upper bound of the stored analog voltage range (see e.g., FIG. 2).

As depicted, aCAM cell 100 includes a "lower bound side" 110 and an "upper bound side" 120, so-called because memristors M1 and M2 are programmed to set the lower bound and the upper bound of the analog voltage range stored by aCAM cell 100, respectively.

Lower bound side 110 includes a transistor T1 and memristor M1 electrically connected to each other in series. Memristor M1, in conjunction with transistor T1, define a voltage divider sub-circuit 112. As depicted, voltage divider sub-circuit 112 generates a gate voltage (G1) at the gate of pull-down transistor T2. When the gate voltage (G1) at the gate of pull-down transistor T2 exceeds a threshold value, pull-down transistor T2 will turn on/activate and "pull-down" (i.e., discharge) the voltage across ML 102, returning a mismatch. As described above, the voltage at the gate of pull-down transistor T2 can be influenced by: (1) the programmed conductance of memristor M1; and (2) analog input voltage signal (V(x)). In particular, when analog input voltage signal (V(x)) is greater than or equal to a threshold voltage (e.g., ($T_L$)), transistor T1 will become more conductive (the programmed conductance of memristor M1 will remain the same during the search operation) and thus the voltage between SL_hi and SL_lo (typically at ground (GND)) will drop across memristor M1, resulting in a small gate voltage (G1) that does not turn on/activate pull-down transistor T2, yielding a match result for lower bound side 110. Here, the value of ($T_L$) (i.e., the threshold voltage that will cause transistor T1 to become more conductive relative to memristor M1) can be programmed by programming the conductance of memristor M1. In this way, the programmed conductance of memristor M1 can be used to set the lower bound of the voltage range stored by aCAM cell 100.

Similar to lower bound side 110, upper bound side 120 includes a transistor T3 and memristor M2 electrically connected to each other in series. Memristor M2, in conjunction with the transistor T3, define a voltage divider sub-circuit 122. Upper bound side 120 differs slightly from lower bound side 110 because voltage divider sub-circuit 122 is electrically connected to an input of an inverter 124 (here the series combination of transistors T4 and T5 operate in conjunction to comprise inverter 124). Inverter 124 operates to invert the voltage output by voltage divider sub-circuit 122. Because pull-down transistor T6 is electrically connected to the output of inverter 124, the inverted voltage output by inverter 124 controls the gate voltage (G2) at the gate of pull-down transistor T6. Similar to above, when the gate voltage (G2) at the gate of pull-down transistor T6 exceeds a threshold value, pull-down transistor T6 will turn on/activate and "pull-down" (i.e., discharge) the voltage across ML 102, returning a mismatch. As described above, the voltage at the gate of pull-down transistor T6 can be influenced by: (1) the programmed conductance of memristor M2; and (2) analog input voltage signal (V(x)). In particular, when analog input voltage signal (V(x)) is less than or equal to a threshold voltage (e.g., ($T_H$)), transistor T3 will not be highly conductive (e.g., have a conductance on the order of 10 nS as compared to a higher conductance state of e.g., 10 mS) and thus the voltage between SL_hi and SL_lo (typically at GND) will remain high at the gate of transistor T3, resulting in a high voltage output for voltage divider sub-circuit 122. However, when this high voltage is inverted by inverter 124, the inverted (now low) voltage causes a low gate voltage (G2) that does not turn on/activate pull-down transistor T6, thus yielding a match result for upper bound side 120. Here, the value of ($T_H$) (i.e., the threshold voltage that will cause transistor T3 to not be highly conductive relative to memristor M2) can be programmed by programming the conductance of memristor M2. In this way, the programmed conductance of memristor M2 can be used to set the upper bound of the voltage range stored by aCAM cell 100

Figure 2:
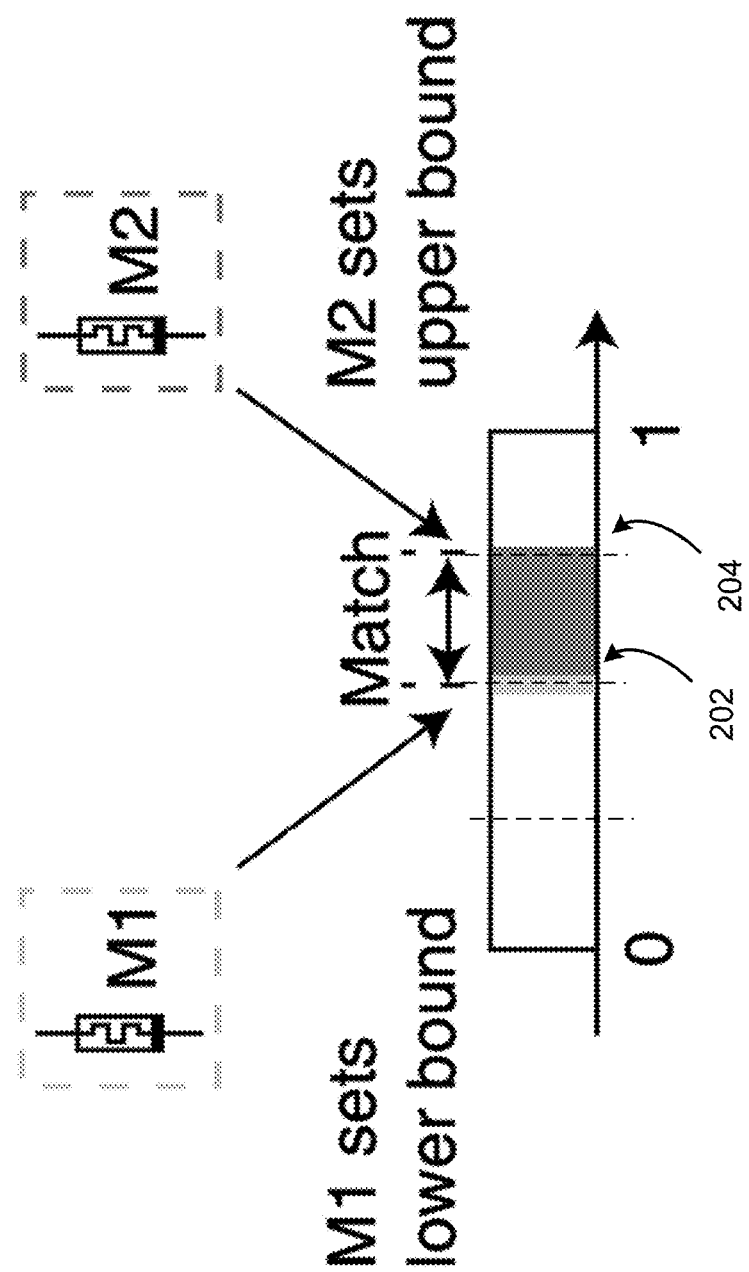
FIG. 2 depicts an example voltage range diagram, in accordance with examples of the presently disclosed technology.

FIG. 2 depicts an example diagram that illustrates how memristors M1 and M2 from aCAM cell 100 can be used to set the lower boundary voltage 202 and the upper boundary voltage 204, respectively, of a stored voltage range for aCAM cell 100. As depicted, aCAM cell 100 will return a match for an analog input voltage signal (V(x)) when analog input voltage signal (V(x)) is within the voltage range defined by lower boundary voltage 202 and upper boundary voltage 204. When analog input voltage signal (V(x)) is outside the voltage range defined by lower boundary voltage 202 and upper boundary voltage 204, aCAM cell 100 will return a mismatch. As described above, the conductance of memristors M1 and M2 respectively can be programmed to set/define lower boundary voltage 202 and upper boundary voltage 204.

As described above, precision for aCAM cells (including aCAM cell 100) is limited because the memristors they use to set range boundaries can only be programmed to a discrete/finite number of conductance states. Leveraging the diagram of FIG. 2 for concept illustration, this means that lower boundary voltage 202 and upper boundary voltage 204 can only be placed in a discrete/finite number of locations (depicted for concept illustration by the vertical dashed lines). In turn, this limits the number of programmable levels that an aCAM cell (e.g., aCAM cell 100) can store/search for. As described above, and as will be described in greater detail below, examples of the presently disclosed technology provide new circuits that increase the number of programmable levels for aCAMs by leveraging the concept of range segmenting to representationally store an analog voltage range across multiple aCAM cells/sub-circuits (here the representationally stored analog voltage range may correspond to an entry of a stored word). In this way, a circuit of the presently disclosed technology can increase precision (i.e., the number of programmable levels for the circuit) linearly with each aCAM cell/sub-circuit added to the circuit. Accordingly, circuits of the presently disclosed technology can be used to carry out more complex computations than conventional aCAMs—and thus can be used in a wider range of computational applications.

Figure 3:
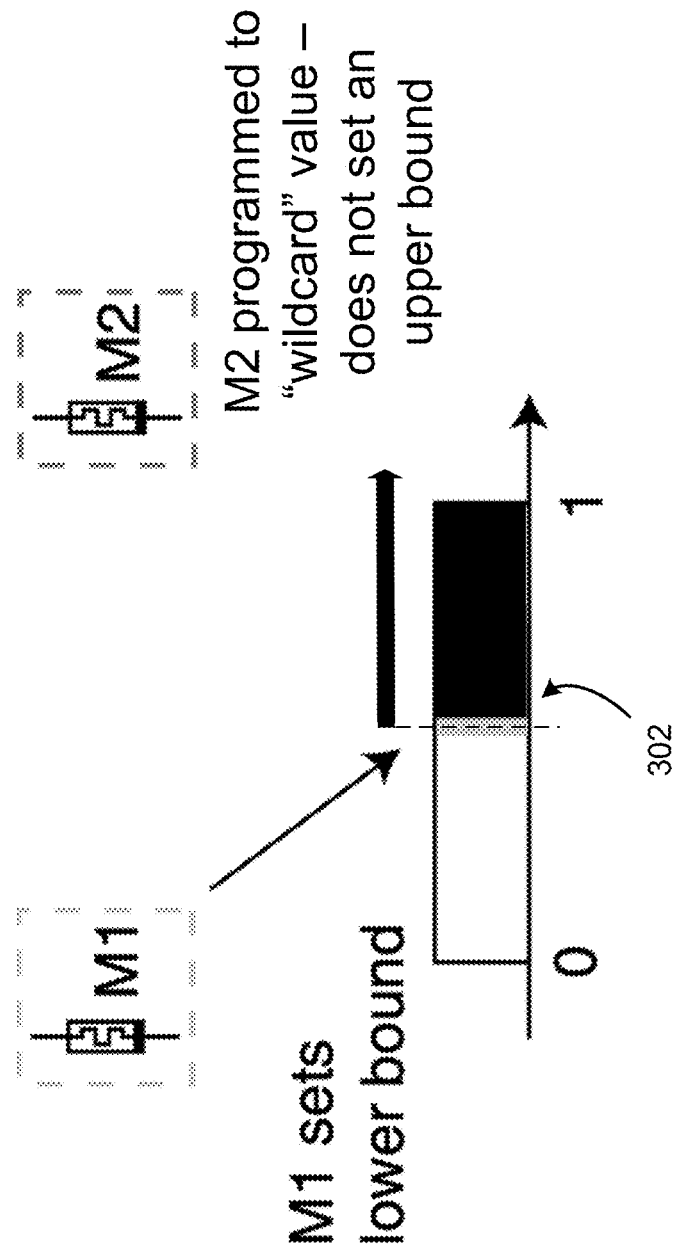
FIG. 3 depicts another example voltage range diagram, in accordance with examples of the presently disclosed technology.

FIG. 3 depicts an example diagram that illustrates how memristors M1 and M2 from aCAM cell 100 can be programmed to store an open-ended voltage range for aCAM cell 100 (i.e., a stored voltage range that is un-bounded on at least one end). As depicted, aCAM cell 100 will return a match for an analog input voltage signal (V(x)) whenever analog input voltage signal (V(x)) is greater than or equal to a lower boundary voltage 302 set by memristor M1. In other words, aCAM cell 100 will only return a mismatch when analog input voltage signal (V(x)) is less than lower boundary voltage 302. As described above, the conductance of memristor M1 can be programmed to set lower boundary voltage 302.

Here, FIG. 3 differs from FIG. 2 because the conductance of memristor M2 has been programmed to a "wildcard" value (sometimes referred to as a "don't care" value) that practically always returns a match for the upper boundary side 120 of aCAM cell 100 (i.e., returns a match for the upper boundary side 120 of aCAM cell 100 for any value of analog input voltage signal (V(x)) that would be received by aCAM cell 100 in practice). In general, deep conductance states of memristors can be used as wildcard values that practically set open-ended lower and upper boundaries for an aCAM cell. These deep conductance states (e.g., a deep low conductance state (DLCS) for a lower boundary wildcard value and a deep high conductance state (DHCS) for an upper boundary wildcard value) will be far outside the reliably programmable conductance ranges of the memristors. For example, if the memristors of aCAM cell 100 are programmed in the range [1 uS, 100 uS], deep conductance states of e.g., 0.01 uS and 1000 uS can be used for wildcard values that practically set open-ended lower and upper boundaries for aCAM cell 100 respectively. These deep conductance states are typically difficult to program in a reliable way, and are thus reserved for wildcard values where an error of e.g., 10% in programming can be acceptable. By programming memristors of aCAM cell 100 to wildcard values/deep conductance states, examples can set deep state lower and upper voltage boundaries that are practically open-ended. In other words, because in practice input/search voltage values received by an aCAM cell/sub-circuit will generally always be within the deep state lower and upper voltage boundaries set by programming memristors of an aCAM cell/sub-circuit to wildcard values, it can be generally stated that programmed wildcard values will always return a match.

Thus, in FIG. 3, memristor M2 practically sets an open-ended "upper boundary" for the analog voltage range stored by aCAM cell 100. It should be understood that in other examples, the conductance of memristor M2 may be programmed to set a "true" upper boundary voltage (i.e., an upper boundary voltage that that practically defines a "less than or equal to" condition at the upper boundary), and the conductance of memristor M1 may be programmed to a "wildcard" value that practically always returns a match for the lower boundary side 110 of aCAM cell 100 (i.e., such programming may practically store an open-ended voltage range that is only practically bounded at the upper end). Similarly, in certain examples the conductances of both memristors M1 and M2 may be programmed to "wildcard" values such that aCAM cell 100 practically always returns a match (i.e., returns a match for any value of analog input voltage signal (V(x)) that aCAM cell 100 would receive in practice).

As will be described in greater detail below, examples can utilize "wildcard" programming to store open-ended voltage ranges for individual aCAM cells/sub-circuits that are used in combination with other aCAM cells/sub-circuits to representationally store a (larger) analog voltage range.

Figure 4:
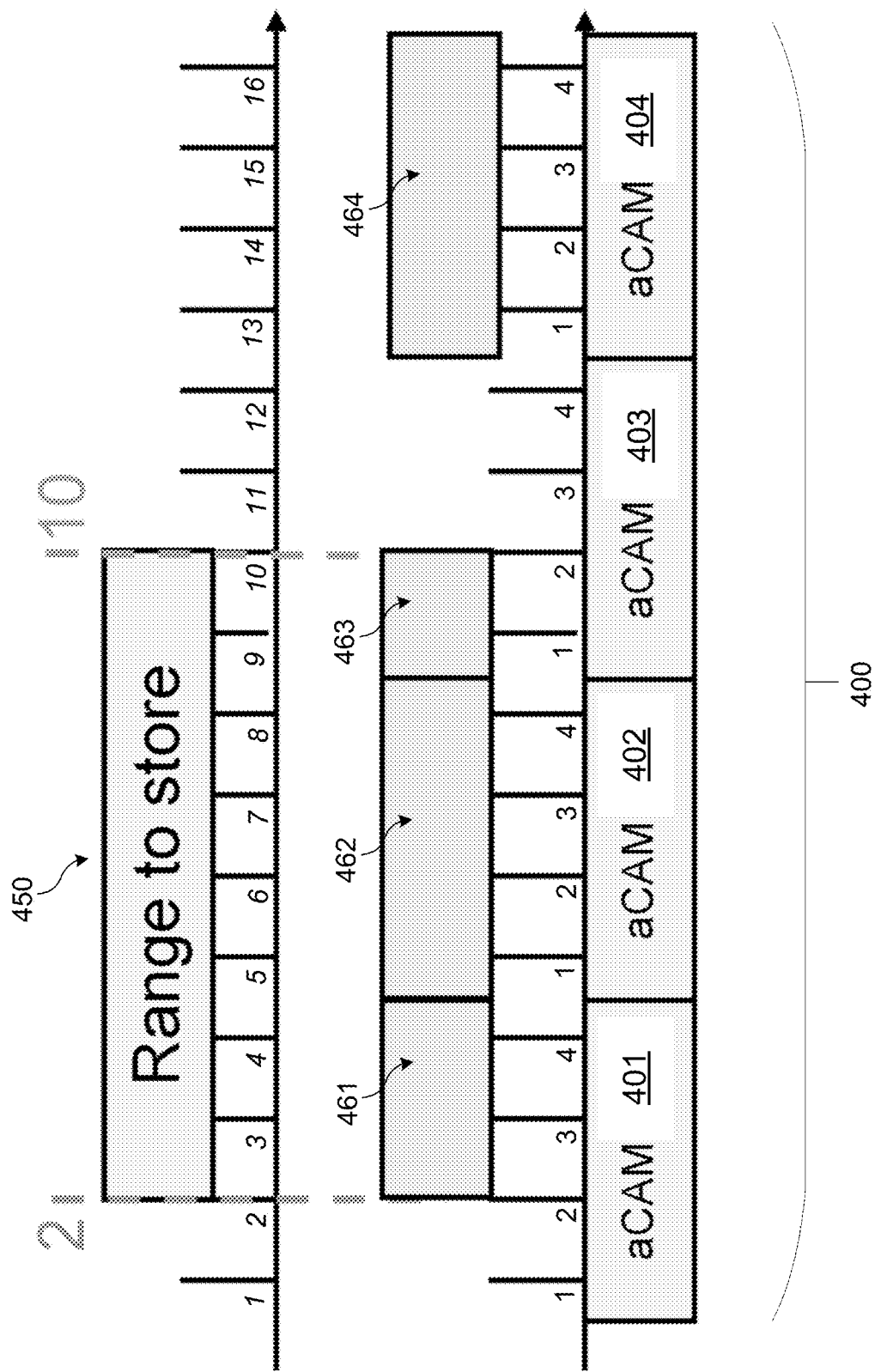
FIG. 4 depicts an example conceptual diagram, in accordance with examples of the presently disclosed technology.

FIG. 4 depicts an example conceptual diagram that can be used to illustrate the concept of range segmenting. In particular, FIG. 4 illustrates how an example circuit 400 can be used to representationally store a large range 450 from 2-10 (here integer values are used for illustration purposes, but it should be understood that circuit 400 can store an analog voltage range corresponding to the stored integer range of 2-10). Large range 450 may correspond to an entry of a word (i.e., by representationally storing large range 450, circuit 400 can store a word entry corresponding to/represented by large range 450).

As described above, through "range segmenting," examples can representationally store a range across multiple aCAM cells/sub-circuits—where each aCAM cell/sub-circuit representationally stores a segment of the (larger) representationally stored range.

Here, the term "representationally stores" is used because the range that a given aCAM cell/sub-circuit is actually programmed to store, may be different from the segment it representationally stores. This is in part because a typical aCAM cell/sub-circuit can only be programmed to store ranges having a minimum possible lower boundary of 1 and a maximum possible upper boundary of $2^M$, where "M" represents the number of programmable bits of the aCAM cell/sub-circuit (as well as the number of programmable bits of memristors used in the aCAM cell/sub-circuit), and "$2^M$" represents the number of programmable levels of the aCAM cell/sub-circuit (here it should be understood that in certain examples where "0" is the lowest programmable level of the aCAM cell/sub-circuit instead of 1, the aCAM cell/sub-circuit can store ranges having a minimum possible lower boundary of 0 and a maximum possible upper boundary $(2_M-1)$). However, through range segmenting, example circuits can representationally store ranges that have upper or lower boundaries higher than $2^M$. For instance, a circuit in accordance with examples of the presently disclosed technology comprised of "N" aCAM cells/sub-circuits can representationally store ranges having a maximum possible upper boundary of $N \cdot 2^M$ (or a maximum possible lower boundary of $(N*2^M-1)$)—even though the circuit's constituent aCAM cells/sub-circuits can only be programmed to store ranges having a maximum possible upper or lower boundary of $2^M$. As will be described below, examples utilize strategic programming of boundary values within the individual aCAM cells/sub-circuits so that the individual aCAM cells/sub-circuits can representationally store segments that include values higher than $2^M$.

Referring again to FIG. 4, example circuit 400 comprises four aCAM sub-circuits (i.e., aCAMs 401-404) connected along a match line (not pictured) such that they perform Boolean "AND" operations with respect to each other. Here, each aCAM sub-circuit of circuit 400 may be the same/similar as aCAM cell 100 of FIG. 1, although this need not be the case.

As depicted in FIG. 4, each aCAM sub-circuit of circuit 400 has 4 programmable levels (i.e. programmable levels 1, 2, 3, and 4—the programmable levels of the aCAM sub-circuits of circuit 400 are depicted at the bottom of FIG. 4) Through range segmenting and strategic programming, examples can utilize the four aCAM sub-circuits of circuit 400 to representationally store ranges across 16 representational levels (the representational levels of the aCAM sub-circuits of circuit 400 are depicted at the top of FIG. 4).

Here, the ordered logical arrangement of aCAM sub-circuits used to store representational levels for circuit 400 may be referred to as an ordered representational level arrangement for circuit 400. Accordingly, each aCAM sub-circuit of circuit 400 may be assigned a placement in the ordered representational level arrangement for circuit 400. For example, aCAM 401 may assigned a first placement in the ordered representational level arrangement (i.e., representational levels 1-4), aCAM 402 may be assigned a second placement in the ordered representational level arrangement (i.e., representational levels 5-8), aCAM 403 may be assigned a third placement in the ordered representational level arrangement (i.e., representational levels 9-12), and aCAM 404 may be assigned a fourth placement in the ordered representational level arrangement (i.e., representational levels 13-16). Further, it can be said that: (1) aCAMs 401-403 precede aCAM 404 in the ordered representational level arrangement; (2) aCAMs 401-402 precede aCAM 403 in the ordered representational level arrangement; and (3) aCAM 401 precedes aCAM 402 in the ordered representational level arrangement. As will be described below, the placement of a given aCAM sub-circuit in the ordered representational level arrangement of circuit 400 can determine which version of an adjusted input signal the given aCAM sub-circuit receives.

Referring again to FIG. 4 and in particular, to aCAM 401, it may be noted that aCAM 401's programmable levels (i.e., programmable levels 1-4) and the representational levels aCAM 401 has been assigned to represent (i.e., representational levels 1-4) are the same. This is because the representational levels aCAM 401 has been assigned to represent can all be directly programmed within aCAM 401.

However, the programmable levels and representational levels of aCAM 402 are different from each other. In particular, a given representational level of aCAM 402 (e.g., representational level 5) is equivalent to its corresponding programmable level increased by the number of programmable levels of the aCAM sub-circuit that precedes aCAM 402 in the ordered representational level arrangement of circuit 400 (i.e., the number of programmable levels of aCAM 401). For example, representational level 5 of aCAM 402 is equivalent to aCAM 402's corresponding programmable level 1, increased by the number of programmable levels (4) of aCAM 401. As described above, aCAM 402 cannot be directly programmed to set upper or lower boundaries higher than 4 because it is only a 2-bit aCAM sub-circuit with 4 programmable levels. However, through strategic programming used in combination with the signal adjustments that will be described in conjunction with FIG. 5, aCAM 402 can be programmed to representationally store/search against an upper or lower boundary higher than 4—namely at representational levels 5-8.

Similarly, the programmable levels and representational levels of aCAM 403 are different from each other. In particular, a given representational level of aCAM 403 (e.g., representational level 10) is equivalent to its corresponding programmable level increased by the number of programmable levels of the two aCAM sub-circuits that precede aCAM 403 in the ordered representational level arrangement of circuit 400 (i.e., the combined number of programmable levels of aCAM 401 and aCAM 402). For example, representational level 10 of aCAM 403 is equivalent to aCAM 403's corresponding programmable level 2, increased by the combined number of programmable levels (8) of aCAMs 401 and 402. As described above, aCAM 403 cannot be directly programmed to set upper or lower boundaries higher than 4 because it is only a 2-bit aCAM sub-circuit with 4 programmable levels. However, through strategic programming used in combination with the signal adjustments that will be described in conjunction with FIG. 5, aCAM 403 can be programmed to representationally store/search against an upper or lower boundary higher than 4—namely at representational levels 9-12.

The programmable levels and representational levels of aCAM 404 are different from each other as well. In particular, a given representational level of aCAM 404 (e.g., representational level 15) is equivalent to its corresponding programmable level increased by the number of programmable levels of the three aCAM sub-circuits that precede aCAM 404 in the representational level arrangement of circuit 400 (i.e., the combined number of programmable levels of aCAMs 401-403). For example, representational level 15 of aCAM 404 is equivalent to aCAM 404's corresponding programmable level 3, increased by the combined number of programmable levels (12) of aCAMs 401-403. As described above, aCAM 404 cannot be directly programmed to set upper or lower boundaries higher than 4 because it is only a 2-bit aCAM sub-circuit with 4 programmable levels. However, through strategic programming used in combination with the signal adjustments that will be described in conjunction with FIG. 5, aCAM 404 can be programmed to representationally store/search against an upper or lower boundary higher than 4—namely at representational levels 13-16.

As examples of the presently disclosed technology appreciate, through range segmenting and strategic programming of boundary values within each aCAM sub-circuit, the four aCAM sub-circuits of circuit 400 can be used in combination to representationally store ranges having a maximum possible upper boundary of 16. Thus, the four aCAM sub-circuits of circuit 400 can be used in combination to representationally store large range 450, which goes from 2-10. In particular, each of aCAMs 401-403 can representationally store a segment of large range 450 such that in combination, they representationally store large range 450 in its entirety.

As depicted in FIG. 4 (and table 1 below), aCAM 401 representationally stores a first segment 461 (here first segment 461 comprises a range from 2-4), aCAM 402 representationally stores a second segment 462 (here second segment 462 comprises a range from 5-8) and aCAM 403 representationally stores a third segment 463 (here third segment 463 comprises a range from 9-10). In the specific example of FIG. 4, aCAM 404 does not representationally store a segment of large range 450. Again, the term "representationally stores" is used because the range a given aCAM sub-circuit is programmed to store may be different than the range the given aCAM cell/sub-circuit representationally stores. For illustration, table 1 below compares the ranges that aCAMs 401-404 are programmed store against the segments of large range 450 that aCAMs 401-404 representationally store.

TABLE 1

| | aCAM 401 | aCAM 402 | aCAM 403 | aCAM 404 |
|---|---|---|---|---|
| Programmed Lower Boundary | 2 | Open-ended - i.e., "wildcard" | Open-ended - i.e., "wildcard" | Open-ended - i.e., "wildcard" |
| Programmed Upper Boundary | Open-ended - i.e., "wildcard" | Open-ended - i.e., "wildcard" | 2 | Open-ended - i.e., "wildcard" |
| Representational Segment Lower Boundary | 2 | 5 | 9 | N/A |
| Representational Segment Upper Boundary | 4 | 8 | 10 | N/A |

As displayed in table 1, in order to representationally store a range from 2-10: (1) the lower boundary of aCAM 401 is programmed to a value of 2, and the upper boundary of aCAM 401 is programmed to an open-ended/"wildcard" value that practically always returns a match; (2) the lower boundary of aCAM 402 is programmed to an open-ended/ "wildcard" value that practically always returns a match, and the upper boundary of aCAM 402 is programmed to an open-ended/"wildcard" value that practically always returns a match; (3) the lower boundary of aCAM 403 is programmed to an open-ended/"wildcard" value that practically always returns a match, and the upper boundary of aCAM 403 is programmed to a value of 2; and (4) the lower boundary of aCAM 404 is programmed to an open-ended/ "wildcard" value that practically always returns a match, and the upper boundary of aCAM 404 is programmed to an open-ended/"wildcard" value that practically always returns a match. As described in conjunction with FIG. 1, the lower and upper boundaries of the individual aCAM sub-circuits (including the "wildcard" values) can be programmed by programming conductances of memristors included in the individual aCAM sub-circuits.

Here, the programmed lower boundary of aCAM 401 (i.e., programmable level 2) sets/defines the lower boundary (i.e., representational level 2) of large range 450 as representationally stored by circuit 400. The programmed upper boundary of aCAM 403 (i.e., programmable level 2) sets the upper boundary (i.e., representational level 10) of large range 450 as representationally stored by circuit 400. Because the other programmable lower/upper boundaries of aCAMs 401-404 are not being used to set representational boundaries for large analog voltage range 450, they are programmed to "wildcard" values that practically always return a match. This strategic programming, along with the signal reduction/adjustments required to search an input signal (x) against such a representationally stored range, will be described in conjunction with FIG. 5 below. However, at a high level, such strategic programming and signal adjustment is designed to address the fact that the programmable levels and representational levels of aCAMs 402-404 are different from each other. As described above, the programmable levels and representational levels of aCAMs 402-404 are different from each other because of programmability limitations the aCAM sub-circuits—namely that they cannot be directly programmed to set lower or upper boundaries above 4.

Figure 5:
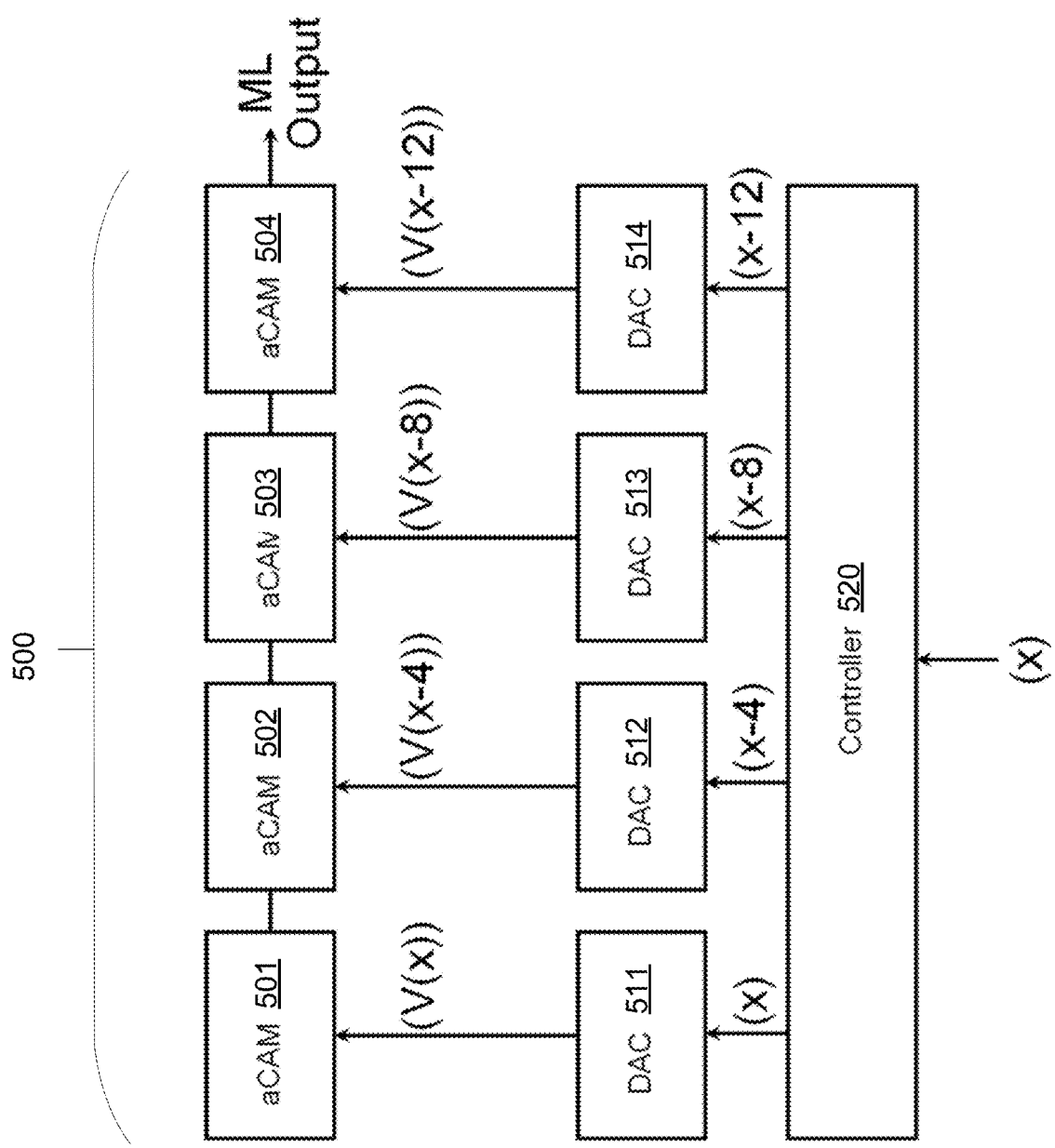
FIG. 5 depicts an example circuit, in accordance with examples of the presently disclosed technology.

FIG. 5 depicts an example circuit 500, in accordance with examples of the presently disclosed technology. Circuit 500 comprises four aCAM sub-circuits (i.e., aCAMs 501-504) connected along a match line such that they perform Boolean "AND" operations with respect to each other. Each aCAM sub-circuit of circuit 500 may be the same/similar as aCAM cell 100, although this need not be the case. Circuit 500 also includes four digital-to-analog converters (DACs) (i.e., DACs 511-514) and a controller 520.

Like the aCAM sub-circuits of circuit 400, each aCAM sub-circuit of circuit 500 has 4 programmable levels. Through range segmenting and strategic programming, examples can utilize the four aCAM sub-circuits of circuit 500 to representationally store analog voltage ranges across 16 representational levels. Here, circuit 500 may have the same/similar ordered representational level arrangement as circuit 400 where aCAM 501 is assigned a first placement in the ordered representational level arrangement (i.e., representational levels (V(1))-(V(4))), aCAM 502 is assigned a second placement in the ordered representational level arrangement (i.e., representational levels (V(5))-(V(8))), aCAM 503 is assigned a third placement in the ordered representational level arrangement (i.e., representational levels (V(9))-(V(12))), and aCAM 504 is assigned a fourth placement in the ordered representational level arrangement (i.e., representational levels (V(13))-(V(16))). Here "V" can represent a function or group of functions utilized by DACs 511-514 to convert digital integer values to analog voltage values.

As depicted, controller 520 receives a digital input signal (x). As alluded to above, because circuit 500 has ($4*2^{M=2}$=16) representational levels, the integer value of digital input signal (x) may be any value from 1 to 16 (in various examples, such an integer value may be represented bit-wise). Accordingly, an analog signal (V(x)) representing the digital input signal (x) may be any value from (V(1)) to (V(16)) (here "V" can represent a function or group of functions utilized by DACs 511-514 to convert digital integer values to analog voltage values).

It should be understood why digital input signal (x) comprising a value greater than (4) could present a challenge for examples of the presently disclosed technology. As described above, aCAMs 501-504 each only have 4 programmable levels, and thus can only be programmed to set boundaries as high as (V(4)).

So for example if circuit 500 were programmed to representationally store an analog voltage range from (V(2))-(V(10)), the representational upper boundary of (V(10)) would have to be set by programming the upper boundary of aCAM 503 to (V(2)) (here this is analogous to setting the representational upper boundary of 10 for large range 450 by programming the upper boundary of aCAM 403 to a value of 2).

Now imagine that the received analog signal (V(x)) is equivalent to (V(9)). In this case, if (V(x))=(V(9)) is provided to aCAM 503 without any reductions/adjustments, aCAM 503 will return a mismatch because (V(x))=(V(9)) is not less than or equal to the programmed upper boundary for aCAM 503 of (V(2)). As aCAMs 501-504 are connected along a match line such that they perform Boolean "AND" operations with respect to each other, if any aCAM sub-circuit (including aCAM 503) returns a mismatch, circuit 500 will return a mismatch. It would be a problem if circuit 500 returned a mismatch when (V(x))=(V(9)) because circuit 500 is designed to representationally store an analog voltage range from (V(2))-(V(10)), within which (V(9)) resides. To avoid such an erroneous result, examples of the presently disclosed technology utilize strategic signal adjustments that involve providing a given aCAM sub-circuit with a version of the analog voltage signal (V(x)) reduced according to an aggregate number of programmable levels of the aCAM cells/sub-circuits that proceed the given aCAM sub-circuit in an ordered representational level arrangement. As described above, such signal adjustment/reduction can account for structural/programmability limitations of the individual aCAM sub-circuits of circuit 500—namely that they cannot be directly programmed to set lower or upper boundaries above (V(4)). For this reason, the programmable levels and representational levels of aCAMs 502-504 are different from each other. As will be described below, through signal adjustment/reduction, examples can account for this difference.

Referring again to FIG. 5, controller 520 performs the signal adjustments/reductions described above. While in the specific example of FIG. 5 such signal adjustments are performed in the digital domain (i.e., before versions of digital input signal (x) are converted to analog voltage signals), in other examples such signal adjustments may be performed in the analog domain (i.e., after digital input signal (x) has been converted to an analog voltage signal).

As depicted, controller 520 provides an unadjusted version of digital input signal (x) to DAC 511 (which is electrically connected to aCAM 501). Here, no reduction is required for the signal provided to DAC 511/aCAM 501 because aCAM 501 is first in the ordered representational level arrangement of circuit 500. Accordingly, all the representational levels assigned to aCAM 501 can be directly programmed into aCAM 501. In other words, aCAM 501 will never be setting a representational boundary higher than (V(4))—against which analog voltage signal (V(x)) would searched.

By contrast, controller 520 provides a reduced version of digital input signal (x) to DAC 512 (which is electrically connected to aCAM 502). Thus, the analog signal provided to aCAM 502 (i.e., analog signal (V(x-4))) has been reduced (in the digital domain) according to the number of programmable levels of aCAM 501 (i.e., 4 programmable levels). Such signal reduction is used to account for the difference between the representational levels of aCAM 502 (i.e., (V(5))-(V(8))) and the programmable levels of aCAM 502 (i.e., (V(1))-(V(4))). Again it should be understood that it will be the programmable levels of aCAM 402 (i.e., (V(1))-(V(4))) that the analog signal provided to aCAM 502 (i.e., analog signal (V(x-4)) will be directly searched against.

Similarly, controller 520 provides a reduced version of digital input signal (x) to DAC 513 (which is electrically connected to aCAM 503). Thus, the analog signal provided to aCAM 503 (i.e., analog signal (V(x-8))) has been reduced (in the digital domain) according to a combined number of programmable levels of aCAMs 501 and 502 (i.e., 8 programmable levels). Such signal reduction is used to account for the difference between the representational levels of aCAM 503 (i.e., (V(9))-(V(12))) and the programmable levels of aCAM 503 (i.e., (V(1))-(V(4))). Again it should be understood that it will be the programmable levels of aCAM 503 (i.e., (V(1))-(V(4))) that the analog signal provided to aCAM 503 (i.e., analog signal (V(x-8)) will be directly searched against.

Likewise, controller 520 provides a reduced version of digital input signal (x) to DAC 514 (which is electrically connected to aCAM 504). Thus, the analog signal provided to aCAM 504 (i.e., analog signal (V(x-12))) has been reduced (in the digital domain) according to a combined number of programmable levels of aCAMs 501-503 (i.e., 12 programmable levels). Such signal reduction is used to account for the difference between the representational levels of aCAM 404 (i.e., (V(13))-(V(16))) and the programmable levels of aCAM 504 (i.e., (V(1))-(V(4))) that the analog signal provided to aCAM 504 (i.e., analog signal (V(x-12)) will be searched against. Again it should be understood that it will be the programmable levels of aCAM 504 (i.e., (V(1))-(V(4))) that the analog signal provided to aCAM 504 (i.e., analog signal (V(x-12)) will be directly searched against.

As described above, through range segmenting and strategic signal adjustments, circuit 500 can combine commonly used aCAM cells to representationally store a much wider variety of analog voltage ranges than conventional aCAMs. In this way, circuit 500 can increase precision (e.g., the number of programmable/representational levels that can be used to store a word entry and/or the number of programmable/representational levels that an input signal can be search against) linearly with each aCAM cell/sub-circuit added to the circuit. Accordingly, circuit 500 can be used to carry out more complex computations than conventional aCAMs—and thus can be used in a wider range of computational applications.

Figure 6:
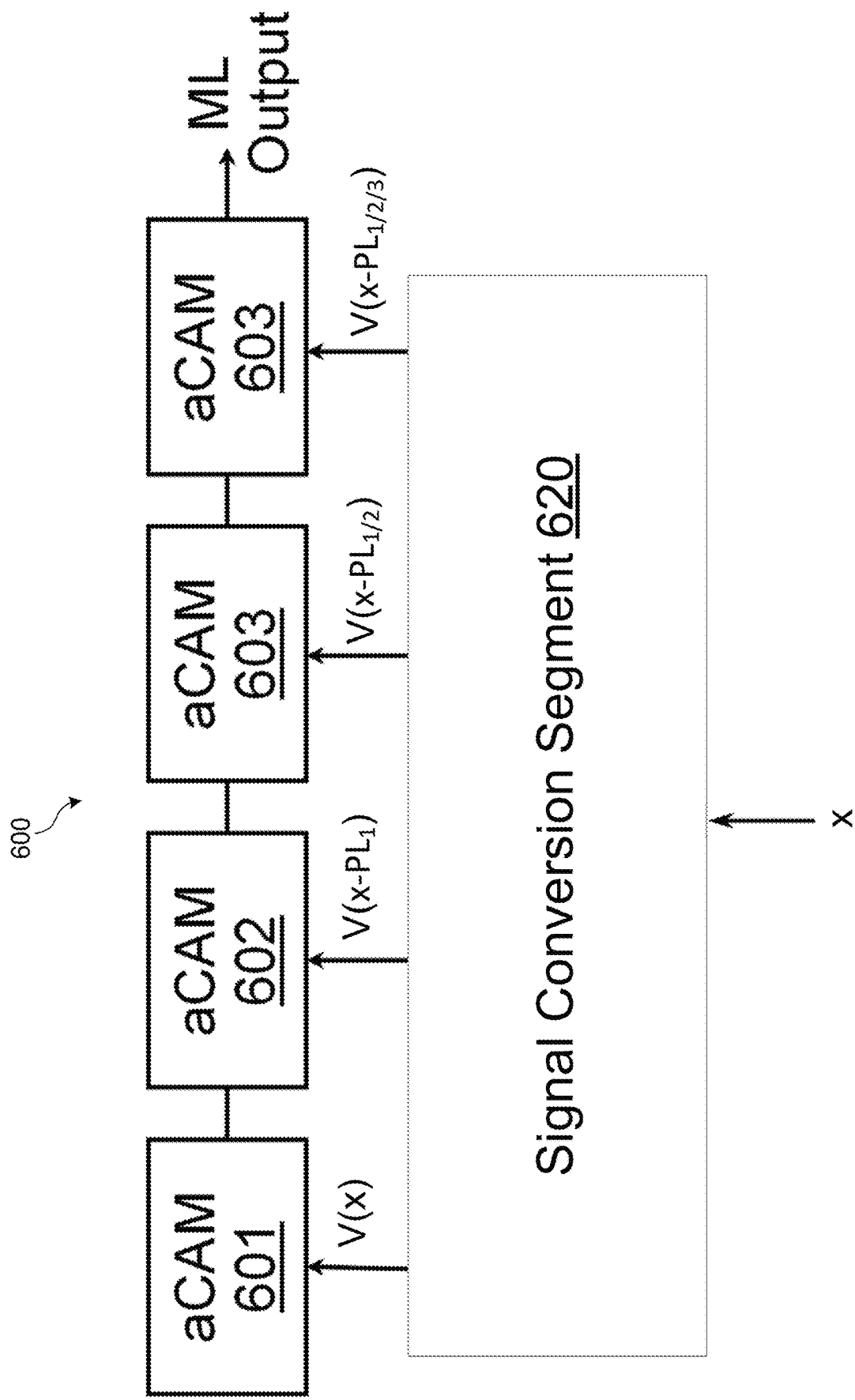
FIG. 6 depicts an example circuit, in accordance with examples of the presently disclosed technology.

FIG. 6 depicts an example circuit 600, in accordance with examples of the presently disclosed technology. In particular, circuit 600 depicts an abstract/generic circuit design from which circuits 400 and 500 can be derived.

As depicted, circuit 600 comprises four aCAM sub-circuits (i.e., aCAMs 601-604) connected along a match line such that they perform Boolean "AND" operations with respect to each other. Each aCAM sub-circuit of circuit 600 may be the same/similar as aCAM cell 100 of FIG. 1, although this need not be the case. While circuit 600 includes four aCAM sub-circuits, it should be understood that in other examples circuit 600 may generally comprise two or more aCAM sub-circuits (e.g., a first aCAM sub-circuit, a second sub-circuit etc.). Circuit 600 also includes a signal conversion segment 620.

As described in conjunction with FIGS. 4-5, circuit 600 may include an ordered representational level arrangement where each aCAM sub-circuit of circuit 600 is assigned a placement in the ordered representational level arrangement (such placement assignment will determine what analog voltage signal each aCAM sub-circuit will be provided with). For example, aCAM 601 may be assigned a first placement in the ordered representational level arrangement that includes representational levels comprised of integer values from (1) to ($2^M$), where "M" represents the number of programmable bits of aCAM 601. aCAM 602 may be assigned a second placement in the ordered representational level arrangement that includes representational levels comprised of integer values from ($2^M$+1) to ($2^M$+$2^N$), where "N" represents the number of programmable bits of aCAM 602. Likewise, aCAM 603 may be assigned a third placement in the ordered representational level arrangement that includes representational levels comprised of integer values from ($2^M$+$2^N$+1) to ($2^M$+$2^N$+$2^P$), where "P" represents the number of programmable bits of aCAM 603, and so on. In the specific example of FIG. 6, aCAM 601 may be assigned the first placement of the ordered representational level arrangement for circuit 600, aCAM 602 may be assigned the second placement of the ordered representational level arrangement for circuit 600, aCAM 603 may be assigned the third placement of the ordered representational level arrangement for circuit 600, and aCAM 604 may be assigned the fourth placement of the ordered representational level arrangement for circuit 600. Assuming each aCAM sub-circuit of circuit 600 has "M" programmable bits, the number of representational/programmable levels for circuit 600 may be ($4*2^M$).

Leveraging the ordered representational level arrangement described above, two or more of the aCAM sub-circuits of circuit 600 may be used in combination to representationally store an analog voltage range where a given aCAM sub-circuit representationally stores a segment of the (larger) representationally stored analog voltage range. For instance, in a first example an analog voltage range could be representationally stored across aCAMs 601 and 602, in a second example an analog voltage range could be representationally stored across aCAMs 601-603, in a third example an analog voltage range could be representationally stored across aCAMs 601-604, in a fourth example an analog voltage range could be representationally stored across aCAMs 602 and 603, in a fifth example an analog voltage range could be representationally stored across aCAMs 602-604, etc. In each example, the representationally stored analog voltage can represent an entry of a word.

As described above, each aCAM sub-circuit of circuit 600 may comprise two memristors which can be programmed to representationally store segments of the (larger) analog voltage range. For example, aCAM 601 may comprise a first memristor and a second memristor, aCAM 602 may comprise a third memristor and a fourth memristor, aCAM 603 may comprise a fifth memristor and a sixth memristor, and aCAM 604 may comprise a seventh memristor and an eighth memristor.

Expanding the second example from above (i.e., where the analog voltage range is representationally stored across aCAMs 601-603), the first memristor of aCAM 601 may be used to representationally set a lower boundary for the analog voltage range representationally stored across aCAMs 601-603. In particular, the first memristor of aCAM 601 may be programmed to set a lower boundary threshold voltage ($V_{1TL}$) for aCAM 601, which may representationally set the lower boundary for the (larger) analog voltage range. The sixth memristor of aCAM 603 may be used to representationally set an upper boundary for the analog voltage range representationally stored across aCAMs 601-603. In particular, the sixth memristor of aCAM 603 may be programmed to set an upper boundary threshold voltage ($V_{3TH}$) for aCAM 603, which may representationally set the upper boundary for the (larger) analog voltage range.

As described above, the memristors of circuit 600 that are not being used to set representational boundaries for the (larger) analog voltage range can be programmed to "wildcard" values that practically always return a match for their given circuit segments. For example, the second memristor (of aCAM 601) may be programmed to set an open-ended upper boundary threshold voltage ($V_{1TH="wildcard"}$) for aCAM 601 such that aCAM 601 returns a match along the match line unless the analog voltage signal received by aCAM 601 is less than (Vim). Similarly, the fifth memristor (of aCAM 603) may be programmed to set an open-ended lower boundary threshold voltage ($V_{3TL="wildcard"}$) for aCAM 603 such that aCAM 603 returns a match along the match line unless the analog voltage signal received by aCAM 603 is greater than ($V_{3TH}$). Relatedly, the third memristor (of aCAM 602) may be programmed to set an open-ended lower boundary threshold voltage ($V_{2TL="wildcard"}$) for aCAM 602 and the fourth memristor (of aCAM 602) may be programmed to set an open-ended upper boundary threshold voltage ($V_{2TH="wildcard"}$) for aCAM 602 such that aCAM 602 returns a match for practically any analog voltage signal it receives (i.e., any analog voltage signal within the deep voltage boundaries defined by the third and fourth memristors). Likewise, the seventh memristor (of aCAM 604) may be programmed to set an open-ended lower boundary threshold voltage ($V_{4TL="wildcard"}$) for aCAM 604 and the eighth memristor (of aCAM 604) may be programmed to set an open-ended upper boundary threshold voltage ($V_{4TH="wildcard"}$) for aCAM 604 such that aCAM 604 returns a match for practically any analog voltage signal value it receives (i.e., any analog voltage signal within the deep voltage boundaries defined by the seventh and eighth memristors).

Referring now to the signal adjustments performed by circuit 600, as depicted, circuit 600 receives a digital input signal (x) via signal conversion segment 620. Signal conversion segment 620 then converts the digital input signal (x) into: (1) a first analog voltage signal (V(x)) provided to aCAM 601; (2) a second analog voltage signal (V(x-$PL_1$)) provided to aCAM 602; (3) a third analog voltage signal (V(x-$PL_{1/2}$)) provided to aCAM 603; and (4) a fourth analog voltage signal (V(x-$PL_{1/2/3}$)) provided to aCAM 604. Here it should be understood that signal conversion segment 620 may comprise various types and combinations of circuit elements (e.g., controllers, digital-to-analog converters, signal subtractor sub-circuits, etc.). Non-exhaustive examples for signal conversion segment 620 will be described in further detail in conjunction with FIGS. 7-9. However the components of signal conversion segment 620 are less important than its overall function which is to implement the strategic signal adjustments described in conjunction with FIG. 5—namely providing a given aCAM sub-circuit with an analog voltage signal that represents a version of a received digital input signal (x) reduced according to an aggregate number of programmable levels of aCAM sub-circuits that precede the given aCAM sub-circuit in an ordered a representational level arrangement for the circuit.

Accordingly, the first analog voltage signal (V(x)) provided to aCAM 601 may comprise an analog voltage signal representing the digital input signal (x) initially received by circuit 600. aCAM 601 will only return a match for the first analog voltage signal (V(x)) if the first analog voltage signal (V(x)) is within a programmed voltage range of aCAM 601—defined by programmed conductances of aCAM 601's constituent memristors (i.e., the first memristor and the second memristor). For example, if the first memristor (of aCAM 601) is programmed to set a lower boundary threshold voltage ($V_{1TL}$) for aCAM 601, and the second memristor (of aCAM 601) is programmed to set an open-ended upper boundary threshold voltage ($V_{1TH=\text{"wildcard"}}$) for aCAM 601, aCAM 601 will return a match unless the first analog voltage signal (V(x)) is less than ($V_{1TL}$).

The second analog voltage signal (V(x-$PL_1$)) provided to aCAM 602 may comprise an analog voltage signal representing a version of the digital input signal (x) reduced according to a number of programmable levels of aCAM 601 (i.e., $PL_1$). As described above, such a signal adjustment is required to account for a difference between the programmable levels of aCAM 602 (e.g., programmable levels (1) to ($2^N$), where "N" represents the number of programmable bits for aCAM 602) and the representational levels aCAM 602 has been assigned to store (e.g., representational levels ($2^M$+1) to ($2^M$+$2^N$), where "M" is the number of programmable bits of aCAM 601). Thus, aCAM 602 will only return a match for the second analog voltage signal (V(x-$PL_1$)) if the second analog voltage signal (V(x-$PL_1$)) is within a programmed voltage range of aCAM 602—defined by programmed conductances of aCAM 602's constituent memristors (i.e., the third memristor and the fourth memristor). For example, if the third memristor (of aCAM 602) is programmed to set an open-ended lower boundary threshold voltage ($V_{2TL=\text{"wildcard"}}$) for aCAM 602, and the fourth memristor (of aCAM 602) is programmed to set an open-ended upper boundary threshold voltage ($V_{2TH=\text{"wildcard"}}$) for aCAM 602, aCAM 602 will return a match for practically any value of the second analog voltage signal (V(x-$PL_1$)) (i.e., any value of the second analog voltage signal (V(x-$PL_1$)) within the deep voltage boundaries defined by the third and fourth memristors).

The third analog voltage signal (V(x-$PL_{1/2}$)) provided to aCAM 603 may comprise an analog voltage signal representing a version of the digital input signal (x) reduced according to an aggregate number of programmable levels of aCAMs 601 and 602 (i.e., $PL_{1/2}$). As described above, such a signal adjustment is required to account for a difference between the programmable levels of aCAM 603 (e.g., programmable levels (1) to ($2^P$), where "P" represents the number of programmable bits for aCAM 603) and the representational levels aCAM 603 has been assigned to store (e.g., representational levels ($2^M$+$2^N$+1) to ($2^M$+$2^N$+$2^P$)). Thus, aCAM 603 will only return a match for the third analog voltage signal (V(x-$PL_{1/2}$)) if the third analog voltage signal (V(x-$PL_{1/2}$)) is within a programmed voltage range of aCAM 603—defined by programmed conductances of aCAM 603's constituent memristors (i.e., the fifth memristor and the sixth memristor). For example, if the fifth memristor (of aCAM 603) is programmed to set an open-ended lower boundary threshold voltage ($V_{3TL=\text{"wildcard"}}$) for aCAM 603, and the sixth memristor (of aCAM 603) is programmed to set an (actual) upper boundary threshold voltage ($V_{3TH}$) for aCAM 603, aCAM 603 will return a match unless (V(x-$PL_{1/2}$)) exceeds the upper boundary threshold voltage ($V_{3TH}$) for aCAM 603.

The fourth analog voltage signal (V(x-$PL_{1/2/3}$)) provided to aCAM 604 may comprise an analog voltage signal representing a version of the digital input signal (x) reduced according to an aggregate number of programmable levels of aCAMs 601-603 (i.e., $PL_{1/2/3}$). As described above, such a signal adjustment is required to account for a difference between the programmable levels of aCAM 603 (e.g., programmable levels (1) to ($2^Q$), where "Q" represents the number of programmable bits for aCAM 604) and the representational levels aCAM 604 has been assigned to store (e.g., representational levels ($2^M$+$2^N$+$2^P$+1) to ($2^M$+$2^N$+$2^P$))+$2^Q$. Thus, aCAM 604 will only return a match for the fourth analog voltage signal (V(x-$PL_{1/2/3}$)) if the fourth analog voltage signal (V(x-$PL_{1/2/3}$)) is within a programmed voltage range of aCAM 604—defined by programmed conductances of aCAM 604's constituent memristors (i.e., the seventh memristor and the eighth memristor). For example, if the seventh memristor (of aCAM 604) is programmed to set an open-ended lower boundary threshold voltage ($V_{4TL=\text{"wildcard"}}$) for aCAM 604, and the eighth memristor (of aCAM 604) is programmed to set an open-ended upper boundary threshold voltage ($V_{4TH=\text{"wildcard"}}$) for aCAM 604, aCAM 604 will return a match for practically any value of the fourth analog voltage signal (V(x-$PL_{1/2/3}$)) (i.e., any value of the fourth analog voltage signal (V(x-$PL_{1/2/3}$)) within the deep voltage boundaries defined by the seventh and eighth memristors).

As described above, circuit 600 can receive/handle a digital input signal (x) having an integer value as low as (1) and as high as ($2^M$+$2^N$+$2^P$+$2^Q$) (or an integer value as low as (0) and as high as ($2^M$+$2^N$+$2^P$+$2^Q$−1)), and search that digital input signal (x) against analog voltage ranges representationally stored across up to ($2^M$+$2^N$+$2^P$+$2^Q$) programmable/representational levels. If aCAMs 601-604 are each 2-bit aCAM cells (i.e., M=N=P=Q=2), this means that circuit 600 can receive a digital input signal (x) that can have an integer value as low as (1) and as high as (4*$2^2$=16), and search that digital input signal (x) against analog voltage ranges representationally stored across up to (4*$2^2$=16) programmable/representational levels. By contrast, a conventional 2-bit aCAM cell could only receive/handle a digital input signal (x) that has an integer value as low as (1) and as high as (4), and search that digital input signal (x) against analog voltage ranges stored across up to 4 programmable levels. Through range segmenting and strategic signal adjustments, circuit 600 can combine commonly used aCAM cells to representationally store a much wider variety of analog voltage ranges than conventional aCAMs. In this way, circuit 600 can increase precision (e.g., the number of programmable/representational levels that can be used to store a word entry and/or the number of programmable/representational levels that an input signal can be search against) linearly with each aCAM cell/sub-circuit added to the circuit. Accordingly, circuit 600 can be used to carry out more complex computations than conventional aCAMs— and thus can be used in a wider range of computational applications.

Figure 7:
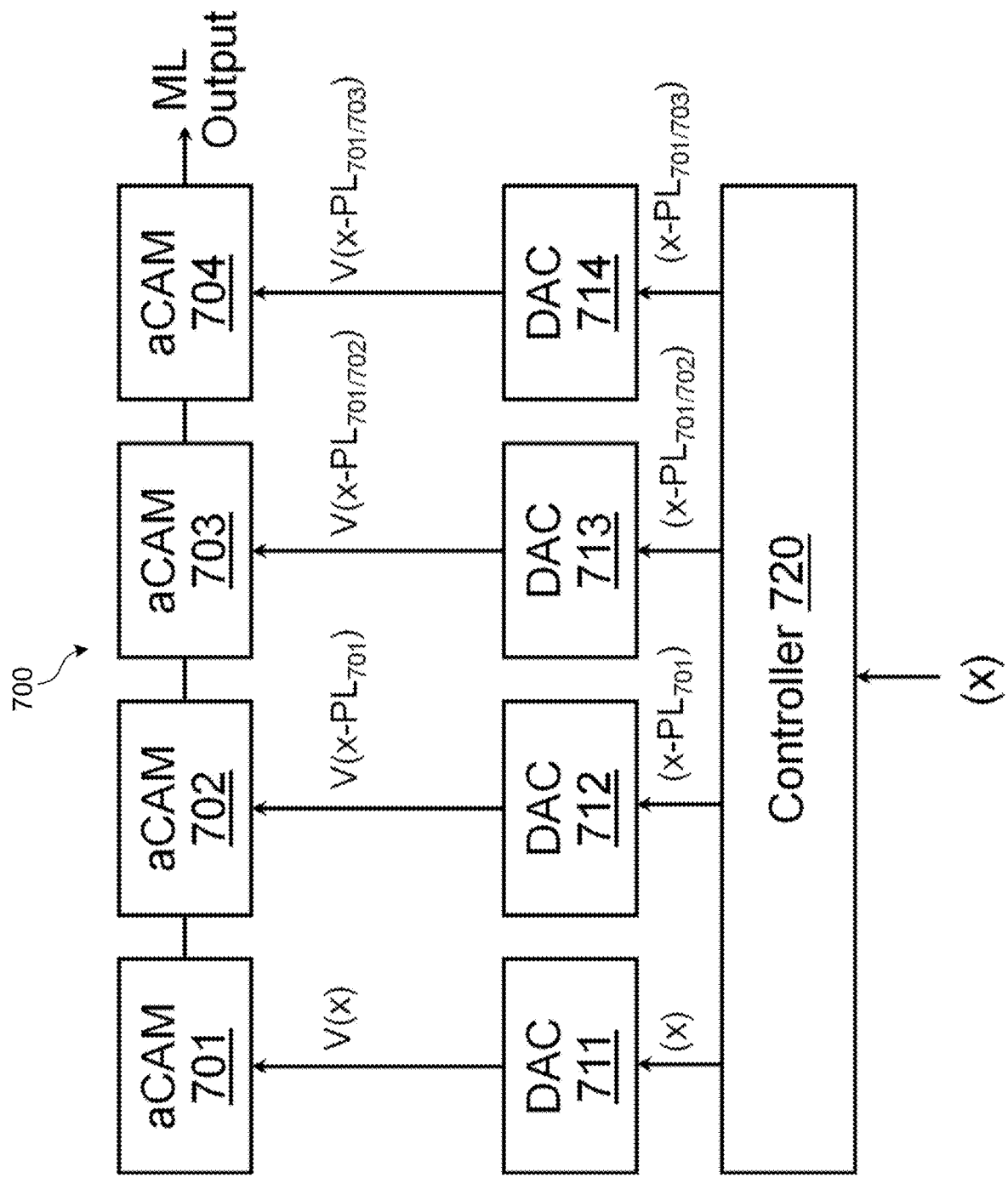
FIG. 7 depicts an example circuit, in accordance with examples of the presently disclosed technology.

FIG. 7 depicts an example circuit 700, in accordance with examples of the presently disclosed technology. Here, circuit 700 may be the same/similar as circuit 600 where digital-to-analog converters (DACs) 711-714 and controller 720 comprise signal conversion segment 620 of circuit 600. Here, the controller 720 (controller 720 may be various types of controllers used for adjusting digital or analog signals) is electrically connected to each of DACs 711-714 (DACs 711-714 may be various types of digital-to-analog converters used for converting digital signals to analog signals). DAC 711 is electrically connected to controller 720 and aCAM 701, DAC 712 is electrically connected to controller 720 and aCAM 702, DAC 713 is electrically connected to controller 720 and aCAM 703, and DAC 714 is electrically connected to controller 720 and aCAM 704. While the specific example of FIG. 7 depicts four DACs and four aCAM sub-circuits, in other examples circuit 700 may comprise two or more DACs electrically connected to two or more aCAM sub-circuits respectively (i.e., two or more DAC-aCAM sub-circuit branches).

As depicted, controller 720 may perform the signal adjustment described in conjunction with FIG. 6 in the digital domain. In particular, controller 720 converts a digital input signal (x) received by circuit 700 into: (1) a first reduced digital signal (x-$PL_1$) provided to DAC 712; (2) a second reduced digital signal (x-$PL_{1/2}$) provided to DAC 713; and (3) a third reduced digital signal (x-$PL_{1/2/3}$) provided to DAC 714. Here controller 720 may provide an unadjusted version of digital input signal (x) to DAC 711.

As described in conjunction with FIG. 6, the first reduced digital signal (x-$PL_1$) may comprise a version of the digital input signal (x) reduced according to a number of programmable levels of aCAM 701 (i.e., $PL_1$). The second reduced digital signal (x-$PL_{1/2}$) may comprise a version of the digital input signal (x) reduced according to a number of programmable levels of aCAMs 701 and 702 (i.e., $PL_{1/2}$). The third reduced digital signal (x-$PL_{1/2/3}$) may comprise a version of the digital input signal (x) reduced according to a number of programmable levels of aCAMs 701-703 (i.e., $PL_{1/2/3}$).

As depicted, each DAC of circuit 700 converts the digital signal it receives into an analog voltage signal. The analog voltage signals of FIG. 7 may be the same/similar as the analog voltage signals of FIG. 6, and may be processed by aCAMs 701-704 in the same/similar manner.

In various examples, controller 720 may be used to program conductances of the memristors of circuit 700, and by extension, program upper and lower boundary voltages of aCAMs 701-704. In certain examples, such programming may be used to transition circuit 700 from a first (high precision) operation mode where a (larger) analog voltage range is representationally stored across two or more aCAM sub-circuits of circuit 700 to a second operation mode (low precision) mode where each aCAM sub-circuit of circuit 700 stores its own individual (small) analog voltage range. In the first (high precision) operation mode, the (larger) analog voltage range may represent a word entry stored with a high level of precision. By contrast, in the second (low precision) mode, each of the individual (small) analog voltage ranges may represent individual word entries stored with a lower level of precision. Thus, in the first (high precision) operation mode, circuit 700 could store one word entry with a high level of precision. By contrast, in the second (low precision) operation mode, circuit 700 could store four word entries with a lower level of precision. Here, controller 720 may only perform signal adjustments/reductions in the first (high precision) operation mode. Controller 720 may automatically switch between the first (high precision) operation mode and second (low precision) mode depending on the types of computations circuit 700 is being used to carry out.

For example, a complex computation (e.g., random forests) that requires searching an input against a higher number of levels may require operation in the first (high precision) operation mode. By contrast, a less complex computation may not require operation in the first (high precision) operation mode. Accordingly, for the less complex computation circuit 700 may be better utilized by storing/searching for four word entries at the lower level of precision.

Figure 8:
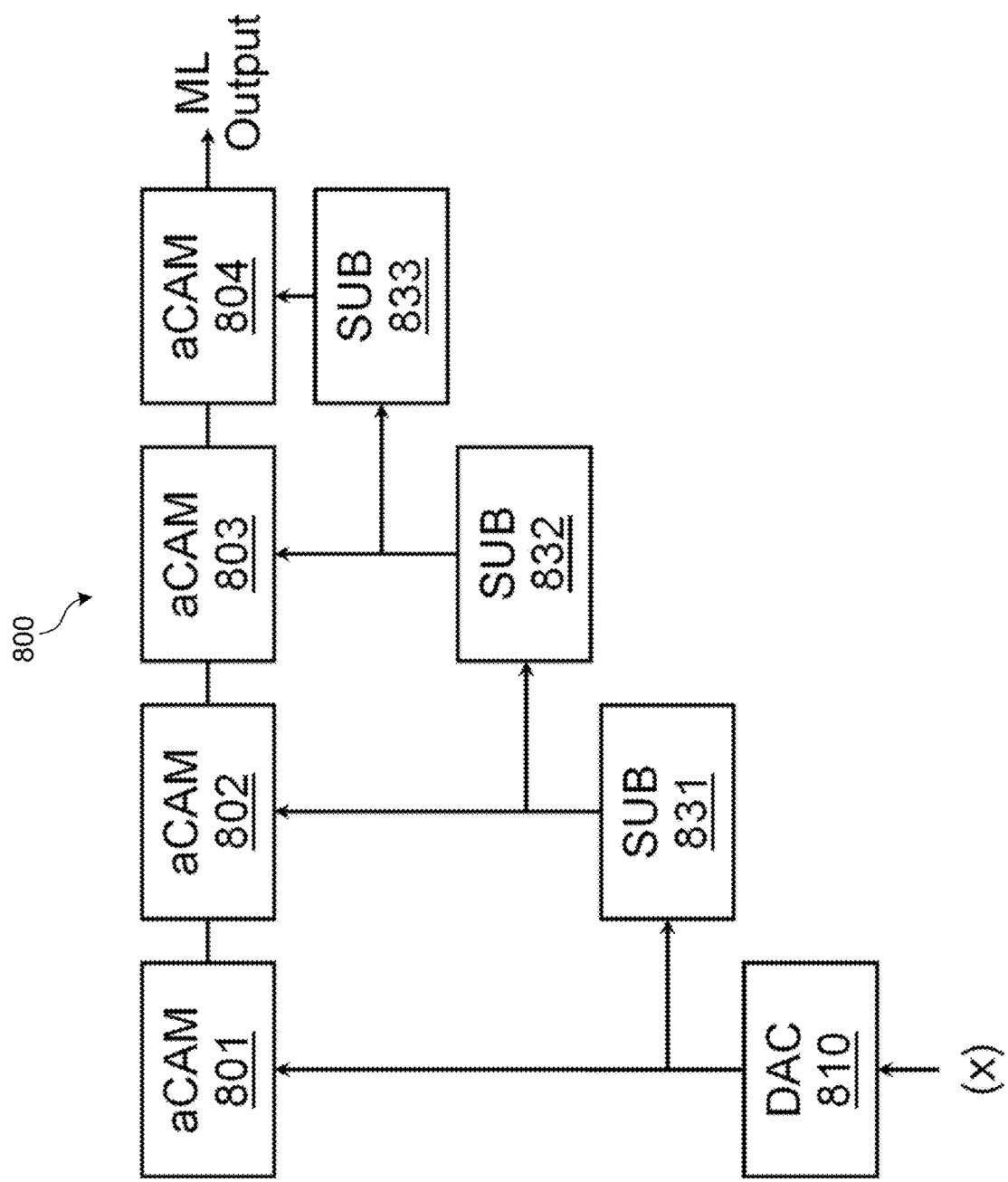
FIG. 8 depicts an example circuit, in accordance with examples of the presently disclosed technology.

FIG. 8 depicts an example circuit 800, in accordance with examples of the presently disclosed technology. Here, circuit 800 may be the same/similar as circuit 600 where a digital-to-analog converter (i.e., DAC 810) and three subtractor sub-circuits (i.e., SUBs 831-833) comprise signal conversion segment 620 of circuit 600.

In contrast to circuit 700 where signal adjustment is performed in the digital domain, in circuit 800 signal adjustment is performed in the analog domain (i.e., after a digital input signal (x) has been converted into an analog voltage signal (V(x)) representing the digital input signal (x)). Also, instead of a controller, circuit 800 utilizes subtractor sub-circuits (see e.g., FIG. 9 for more details) to perform signal adjustments. By using subtractor sub-circuits to perform signal adjustments in the analog domain, circuits of the presently disclosed technology can use single DAC, which is often complex to design and power/area hungry. A potential tradeoff is that this single DAC may require greater precision as it is being used to convert more digital signals.

As depicted in FIG. 8, DAC 810 is electrically connected to a first aCAM sub-circuit (i.e., aCAM 801) and a first subtractor sub-circuit (i.e., SUB 831). SUB 831 is electrically connected to DAC 810, a second aCAM sub-circuit (i.e., aCAM 802), and a second subtractor sub-circuit (i.e., SUB 832). SUB 832 is electrically connected to SUB 831, a third aCAM sub-circuit (i.e., aCAM 803), and a third subtractor sub-circuit (i.e., SUB 833). SUB 833 is electrically connected to SUB 832 and a fourth aCAM sub-circuit (i.e., aCAM 804).

Here, DAC 810 may receive a digital input signal (x) and convert it into a first analog voltage signal (V(x)) representing the digital input signal (x). DAC 810 may then transmit the first analog voltage signal (V(x)) to aCAM 801 and SUB 831. aCAM 801 may process the first analog voltage signal (V(x)) in the same/similar manner as described in conjunction with FIGS. 6-7.

SUB 831 may convert the first analog voltage signal (V(x)) into a second analog voltage signal (V(x-$PL_1$)) which may be defined in the same/similar manner as described on conjunction with FIG. 6. SUB 831 may then transmit the second analog voltage signal (V(x-$PL_1$)) to aCAM 802 and SUB 832. aCAM 802 may process the second analog voltage signal (V(x-$PL_1$)) in the same/similar manner as described in conjunction with FIGS. 6-7.

SUB 832 may convert the second analog voltage signal (V(x-$PL_1$)) into a third analog voltage signal (V(x-$PL_{1/2}$)) which may be defined in the same/similar manner as described on conjunction with FIG. 6. SUB 832 may then transmit the third analog voltage signal (V(x-$PL_{1/2}$)) to aCAM 803 and SUB 833. aCAM 803 may process the third analog voltage signal (V(x-$PL_{1/2}$)) in the same/similar manner as described in conjunction with FIGS. 6-7.

SUB 833 may convert the third analog voltage signal (V(x-$PL_{1/2}$)) into a fourth analog voltage signal (V(x-$PL_{1/2/3}$)) which may be defined in the same/similar manner as described on conjunction with FIG. 6. SUB 833 may then transmit the fourth analog voltage signal (V(x-$PL_{1/2/3}$)) to aCAM 804. aCAM 804 may process the fourth analog voltage signal (V(x-PL$_{1/2/3}$) in the same/similar manner as described in conjunction with FIGS. 6-7.

Figure 9:
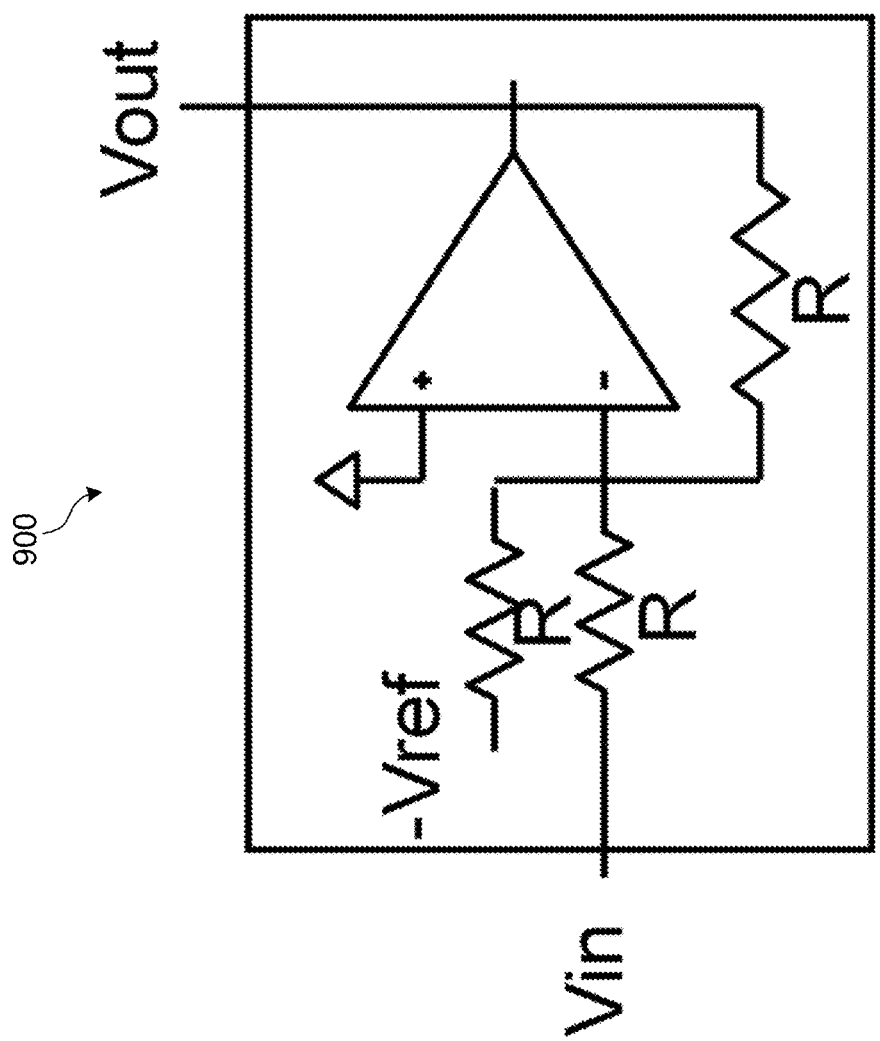
FIG. 9 depicts an example subtractor sub-circuit, in accordance with examples of the presently disclosed technology.

FIG. 9 depicts an example subtractor sub-circuit 900 in accordance with examples of the presently disclosed technology. Subtractor sub-circuit 900 is based on a negative feedback operational amplifier, an input voltage Vin is applied to the negative input through a fixed resistor R. A reference voltage –V_ref is applied to the positive input through a fixed resistor R. The current flowing into the feedback resistor (also R) is equal to V_in/R–V_ref/R and the output voltage is thus V_out=R(V_in/R–V_ref/R)=V_in–V_ref.

Figure 10:
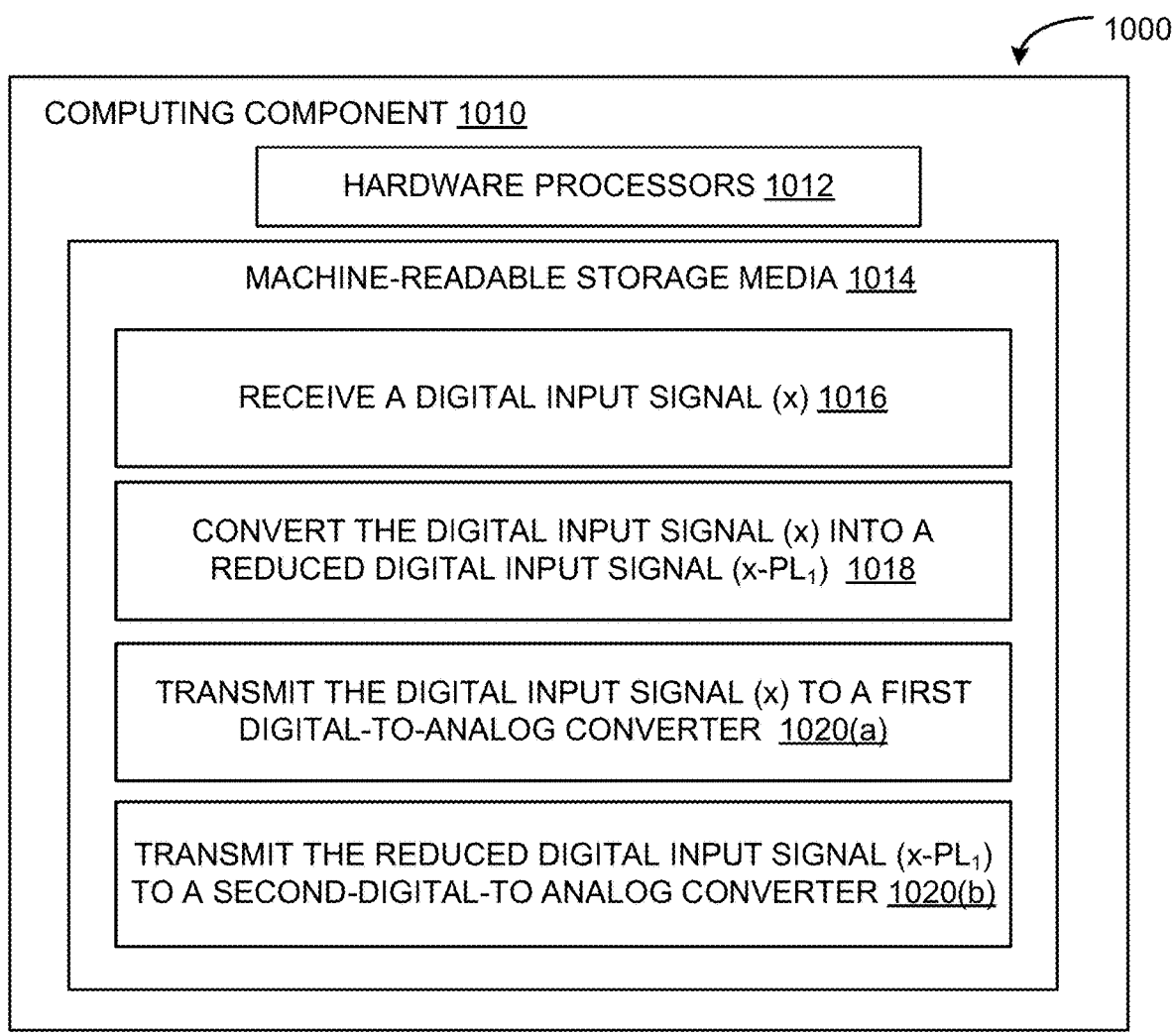
FIG. 10 depicts an example computing system that can be used to implement signal adjustments, in accordance with examples of the presently disclosed technology.

FIG. 10 depicts an example computing system 1000 that can be used to implement signal adjustments, in accordance with various examples of the presently disclosed technology. In various examples, computing system 1000 may be implemented in controller 520 of FIG. 5, signal conversion segment 620 of FIG. 6, and/or controller 720 of FIG. 7. More generally, computing system 1000 may be implemented as part of a circuit described herein. As described above, such a circuit may comprise at least two aCAM sub-circuits that are used in combination to representationally store an analog voltage range.

Referring now to FIG. 10, computing component 1010 may be, for example, a server computer, a controller, or any other similar computing component capable of processing data. In the example implementation of FIG. 10, the computing component 1010 includes a hardware processor 1012, and machine-readable storage medium for 1014.

Hardware processor 1012 may be one or more central processing units (CPUs), semiconductor-based microprocessors, and/or other hardware devices suitable for retrieval and execution of instructions stored in machine-readable storage medium 1014. Hardware processor 1012 may fetch, decode, and execute instructions, such as instructions 1016-1020, to control processes or operations for burst preloading for available bandwidth estimation. As an alternative or in addition to retrieving and executing instructions, hardware processor 1012 may include one or more electronic circuits that include electronic components for performing the functionality of one or more instructions, such as a field programmable gate array (FPGA), application specific integrated circuit (ASIC), or other electronic circuits.

A machine-readable storage medium, such as machine-readable storage medium 1014, may be any electronic, magnetic, optical, or other physical storage device that contains or stores executable instructions. Thus, machine-readable storage medium 1014 may be, for example, Random Access Memory (RAM), non-volatile RAM (NVRAM), an Electrically Erasable Programmable Read-Only Memory (EEPROM), a storage device, an optical disc, and the like. In some examples, machine-readable storage medium 1014 may be a non-transitory storage medium, where the term "non-transitory" does not encompass transitory propagating indicators. As described in detail below, machine-readable storage medium 1014 may be encoded with executable instructions, for example, instructions 1016-1020.

As described above, computing system 1000 may be implemented as part of a circuit described in conjunction with the previous FIGs. Such a circuit may comprise at least two aCAM sub-circuits (i.e., at least a first aCAM sub-circuit and a second aCAM sub-circuit) that are used in combination to representationally store an analog voltage range. Within the circuit, the first aCAM sub-circuit may have a first placement in an ordered representational level arrangement for the circuit and the second aCAM sub-circuit may have a second placement in the ordered representational level arrangement for the circuit. The circuit may also comprise digital-to-analog converters (DACs) (i.e., a first DAC and a second DAC) that convert digital signals into analog signals. Within the circuit, computing system 1000 may be electrically connected to the first and second DACs. The first DAC may be electrically connected to the first aCAM sub-circuit and the second DAC may be electrically connected to the second aCAM sub-circuit. As described above, and as will be described in greater detail below, hardware processor 1012/computing system 1000 may transmit a separate version of a received digital input signal (x) to the first and second DAC respectively. Each DAC may then convert the digital signal it receives into an analog voltage signal, and transmit the analog voltage signals to the first aCAM sub-circuit and second aCAM sub-circuit respectively for processing.

As described above, hardware processor 1012 may execute instruction 1016 to receive a digital input signal (x).

Hardware processor 1012 may execute instruction 1018 to convert the digital input signal (x) into a reduced digital input signal (x-PL$_1$). As described above, the reduced digital input signal (x-PL$_1$) may comprise a version of digital signal (x) reduced according to a number of programmable levels of the first aCAM sub-circuit.

Hardware processor 1012 may execute instruction 1020 (a) to transmit the digital input signal (x) to the first DAC (which is electrically connected to the first aCAM sub-circuit). Accordingly, the first DAC may convert the digital input signal (x) into a first analog voltage signal (V(x)) representing the digital input signal (x). Here, hardware processor 1012 may transmit the digital input signal (x) to the first DAC/first aCAM sub-circuit because the first aCAM sub-circuit is first in the ordered representational level arrangement for the circuit in which hardware processor 1012/computing system 1000 is implemented.

Hardware processor 1012 may execute instruction 1020 (b) to transmit the reduced digital input signal (x-PL$_1$) to the second DAC (which is electrically connected to the second aCAM sub-circuit). Accordingly, the second DAC may convert the reduced digital input signal (x-PL$_1$) into a second analog voltage signal (V(x-PL$_1$)) representing the reduced digital input signal (x-PL$_1$). Here, hardware processor 1012 may transmit the reduced digital input signal (x-PL$_1$) to the second DAC/second aCAM sub-circuit because the second aCAM sub-circuit is second in the ordered representational level arrangement for the circuit in which hardware processor 1012/computing system 1000 is implemented.

Upon receiving the first analog voltage signal (V(x)) and second analog voltage signal (V(x-PL$_1$)) respectively, the first aCAM sub-circuit and the second aCAM sub-circuit may process the analog voltage signals in the same/similar manner as described in conjunction with the previous FIGs.

Figure 11:
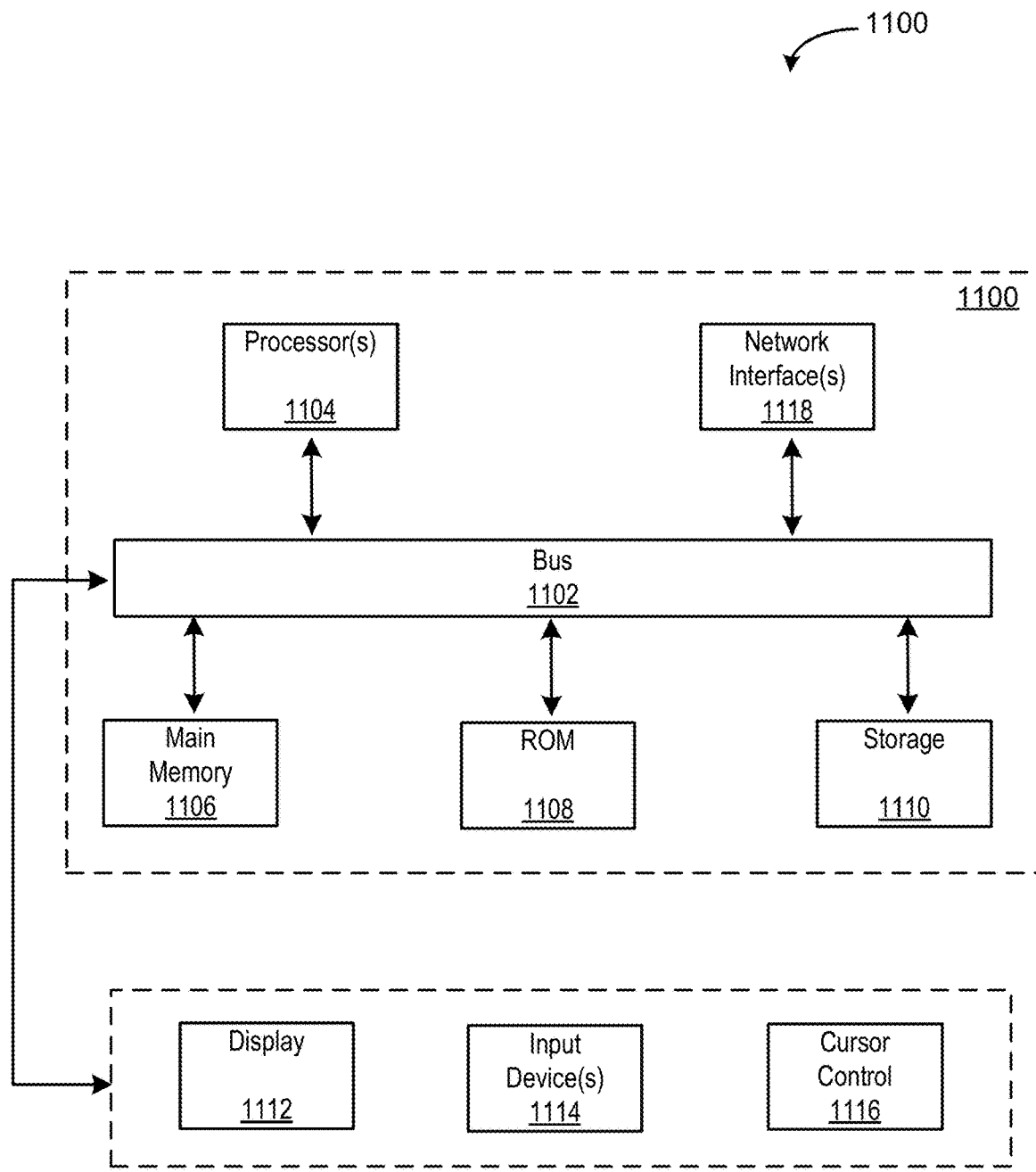
FIG. 11 depicts a block diagram of an example computer system in which various of the examples described herein may be implemented The figures are not exhaustive and do not limit the present disclosure to the precise form disclosed.

FIG. 11 depicts a block diagram of an example computer system 1100 in which various of the examples described herein may be implemented. For example, computer system 1100 may be used to implement controller 520 of FIG. 5, controller 720 of FIG. 7, computing system 1000 of FIG. 10, and/or may be used as part of signal conversion segment 620 of FIG. 6.

The computer system 1100 includes a bus 1112 or other communication mechanism for communicating information, one or more hardware processors 1104 coupled with bus 1112 for processing information. Hardware processor(s) 1104 may be, for example, one or more general purpose microprocessors.

The computer system 1100 also includes a main memory 1106, such as a random access memory (RAM), cache and/or other dynamic storage devices, coupled to bus 1112 for storing information and instructions to be executed by processor 1104. Main memory 1106 also may be used for storing temporary variables or other intermediate information during execution of instructions to be executed by processor 1104. Such instructions, when stored in storage media accessible to processor 1104, render computer system 1100 into a special-purpose machine that is customized to perform the operations specified in the instructions.

The computer system 1100 further includes a read only memory (ROM) 908 or other static storage device coupled to bus 1112 for storing static information and instructions for processor 1104. A storage device 1110, such as a magnetic disk, optical disk, or USB thumb drive (Flash drive), etc., is provided and coupled to bus 1112 for storing information and instructions.

The computer system 1100 may be coupled via bus 1112 to a display 1112, such as a liquid crystal display (LCD) (or touch screen), for displaying information to a computer user. An input device 1114, including alphanumeric and other keys, is coupled to bus 1112 for communicating information and command selections to processor 904. Another type of user input device is cursor control 1116, such as a mouse, a trackball, or cursor direction keys for communicating direction information and command selections to processor 904 and for controlling cursor movement on display 1112. In some embodiments, the same direction information and command selections as cursor control may be implemented via receiving touches on a touch screen without a cursor.

The computing system 1100 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 1100 may implement the techniques described herein using customized hard-wired logic, one or more ASICs or FPGAs, firmware and/or program logic which in combination with the computer system causes or programs computer system 1100 to be a special-purpose machine. According to one embodiment, the techniques herein are performed by computer system 1100 in response to processor(s) 904 executing one or more sequences of one or more instructions contained in main memory 906. Such instructions may be read into main memory 906 from another storage medium, such as storage device 1110. Execution of the sequences of instructions contained in main memory 906 causes processor(s) 904 to perform the process steps described herein. In alternative embodiments, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 1110. Volatile media includes dynamic memory, such as main memory 906. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 1112. Transmission media can also take the form of acoustic or light waves, such as those generated during radio-wave and infra-red data communications.

The computer system 1100 also includes a communication interface 1118 coupled to bus 1112. Network interface 1118 provides a two-way data communication coupling to one or more network links that are connected to one or more local networks. For example, communication interface 1118 may be an integrated services digital network (ISDN) card, cable modem, satellite modem, or a modem to provide a data communication connection to a corresponding type of telephone line. As another example, network interface 1118 may be a local area network (LAN) card to provide a data communication connection to a compatible LAN (or WAN component to communicated with a WAN). Wireless links may also be implemented. In any such implementation, network interface 1118 sends and receives electrical, electromagnetic or optical indicators that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet." Local network and Internet both use electrical, electromagnetic or optical indicators that carry digital data streams. The indicators through the various networks and the indicators on network link and through communication interface 1118, which carry the digital data to and from computer system 1100, are example forms of transmission media.

The computer system 1100 can send messages and receive data, including program code, through the network(s), network link and communication interface 1118. In the Internet example, a server might transmit a requested code for an application program through the Internet, the ISP, the local network and the communication interface 1118.

The received code may be executed by processor 904 as it is received, and/or stored in storage device 1110, or other non-volatile storage for later execution.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 1100.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

As used herein, a dataset may refer to an ordered collection of data. As described above, a dataset may be a data-related product of a data processing pipeline.

As used herein, data analytics (which may be implemented using machine learning and/or artificial intelligence) may refer to techniques that make predictive determinations regarding, e.g., modeled scenarios and systems. As described above, analytical models derived from data are common data-related products of data processing pipelines.

As used herein, machine learning can refer to methods that, through the use of algorithms, are able to automatically turn datasets into analytical models. In turn, those analytical models are capable of making predictions based on patterns or inferences gleaned from other data/datasets. There has been a push to implement machine learning in enterprise environments, e.g., businesses, so that these entities may leverage machine learning to provide better services and products to their customers, become more efficient in their operations, etc. Implementing machine learning into the enterprise context, also referred to as operationalization, can involve the deployment (and management) of analytical models, i.e., putting analytical models into production.

As used herein, metadata may refer to data that provides information about other data. Within a data processing pipeline, each data-related product and processing step may have metadata associated with it. For example, metadata for a dataset may include textual documentation for the dataset, names of tables/columns/features of the dataset, descriptions of content within the dataset, data sizes within the dataset, data distributions within the dataset, etc. Examples of metadata for a processing step may include the language in which the processing step/program is written, information about input fields used for the processing step, contents of associated documentation for the processing step, class of algorithm used for the processing step, staging or quality assurance (QA) status for the processing step, names of developers/data scientists involved with the processing step, etc.

What is claimed is:

1. A circuit comprising:
   a first aCAM sub-circuit electrically connected to a match line; and
   a second aCAM sub-circuit electrically connected to the match line;
   wherein, upon receiving a digital input signal (x), the circuit:
   converts the digital input signal (x) into a first analog voltage signal (V(x)) and a second analog voltage signal (V(x-$PL_1$)), the first analog voltage signal (V(x)) received by the first aCAM sub-circuit and the second analog voltage signal (V(x-$PL_1$)) received by the second aCAM sub-circuit, wherein:

the first analog voltage signal (V(x)) is an analog voltage signal representing the digital input signal (x), and the second analog voltage signal (V(x-PL$_1$)) is an analog voltage signal representing a version of the digital input signal (x) reduced according to a number of programmable levels of the first aCAM sub-circuit; and returns a match along the match line only when the first analog voltage signal (V(x)) is within a programmed voltage range of the first aCAM sub-circuit and the second analog voltage signal (V(x-PL$_1$)) is within a programmed voltage range of the second aCAM sub-circuit.

2. The circuit of claim 1, wherein:

the first aCAM sub-circuit comprises a first memristor and a second memristor;

the second aCAM sub-circuit comprises a third memristor and a fourth memristor; and the first-fourth memristors each have (M) programmable bits, the (M) programmable bits of a given memristor programmed by tuning conductance of the given memristor.

3. The circuit of claim 2, wherein the circuit comprises at least $2*2^M$ programmable levels for representationally storing an analog voltage range across at least the first aCAM sub-circuit and the second aCAM sub-circuit.

4. The circuit of claim 2, wherein an analog voltage range representationally stored across at least the first aCAM sub-circuit and the second aCAM sub-circuit represents an entry of a word.

5. The circuit of claim 4, wherein:

the first memristor is programmed to set a lower boundary threshold voltage (V$_{1TL}$) for the first aCAM sub-circuit; and the lower boundary threshold voltage (V$_{1TL}$) of the first aCAM sub-circuit sets a representational lower boundary for the analog voltage range representationally stored across at least the first aCAM sub-circuit and the second aCAM sub-circuit.

6. The circuit of claim 5, wherein:

the second memristor is programmed to set a wildcard upper boundary threshold voltage (V$_{1TH=\text{"wildcard"}}$) for the first aCAM sub-circuit such that the first aCAM sub-circuit returns a match along the match line when the first analog voltage signal (V(x)) received by the first aCAM sub-circuit is greater than or equal to the lower boundary threshold voltage (V$_{1TL}$) of the first aCAM sub-circuit and less than or equal to the upper boundary threshold voltage (V$_{1TH=\text{"wildcard"}}$).

7. The circuit of claim 2, further comprising:

a third aCAM sub-circuit electrically connected to the match line; and a fourth aCAM sub-circuit electrically connected to the match line;

wherein, upon receiving the digital input signal (x), the circuit:

converts the digital input signal (x) into the first analog voltage signal (V(x)), the second analog voltage signal (V(x-PL$_1$)), a third analog voltage signal (V(x-PL$_{1/2}$)), and a fourth analog voltage signal (V(x-PL$_{1/2/3}$), the first analog voltage signal (V(x)) received by the first aCAM sub-circuit, the second analog voltage signal V(x-PL$_1$) received by the second aCAM sub-circuit, the third analog voltage signal V(x-PL$_{1/2}$) received by the third aCAM sub-circuit, and the fourth analog voltage signal V(x-PL$_{1/2/3}$) received by the fourth aCAM sub-circuit, wherein:

the third analog voltage signal (V(x-PL$_{1/2}$)) is an analog voltage signal representing the digital input signal (x) reduced according to an aggregated number of programmable levels for the first and second aCAM sub-circuits, and the fourth analog voltage signal (V(x-PL$_{1/2/3}$)) is an analog voltage signal representing a version of the digital input signal (x) reduced according to an aggregated number of programmable levels for the first-third aCAM sub-circuits; and returns a match along the match line only when the first analog voltage signal (V(x)) is within a programmed voltage range of the first aCAM sub-circuit and the second analog voltage signal (V(x-PL$_1$)) is within a programmed voltage range of the second aCAM sub-circuit and the third analog voltage signal (V(x-PL$_{1/2}$)) is within a programmed voltage range of the third aCAM sub-circuit and the fourth analog voltage signal (V(x-PL$_{1/2/3}$)) is within a programmed voltage range of the fourth aCAM sub-circuit.

8. The circuit of claim 7, wherein:

the third aCAM sub-circuit comprises a fifth memristor and a sixth memristor;

the fourth aCAM sub-circuit comprises a seventh memristor and an eighth memristor; and the first-eighth memristors each have (M) programmable bits, the (M) programmable bits of a given memristor programmed by tuning conductance of the given memristor.

9. The circuit of claim 8, wherein the circuit comprises at least $4*2^M$ programmable levels for representationally storing an analog voltage range across at least two of the first-fourth aCAM sub-circuits.

10. The circuit of claim 8, wherein:

an analog voltage is representationally stored across the first-third aCAM sub-circuits;

the sixth memristor is programmed to set an upper boundary threshold voltage (V$_{3TH}$) for the third aCAM sub-circuit;

the upper boundary threshold voltage (V$_{3TH}$) for the third aCAM sub-circuit representationally sets an upper boundary of the analog voltage range representationally stored across first-third aCAM sub-circuits; and the fifth memristor is programmed to set an open-ended lower boundary threshold voltage (V$_{3TL=\text{"wildcard"}}$) for the third aCAM sub-circuit such that the third aCAM sub-circuit returns a match along the match line whenever the third analog voltage signal (V(x-PL$_{1/2}$)) received by the third aCAM sub-circuit is less than or equal to the upper boundary threshold voltage (V$_{3TH}$) for the third aCAM sub-circuit.

11. The circuit of claim 10, wherein:

the third memristor is programmed to set an open-ended lower boundary threshold voltage (V$_{2TL=\text{"wildcard"}}$) for the second aCAM sub-circuit and the fourth memristor is programmed to set an open-ended upper boundary threshold voltage (V$_{2TH=\text{"wildcard"}}$) for the second aCAM sub-circuit such that the second aCAM sub-circuit returns a match along the match line for any value of the second analog voltage signal (V(x-PL$_1$)); and the seventh memristor is programmed to set an open-ended lower boundary threshold voltage (V$_{4TL=\text{"wildcard"}}$) for the fourth aCAM sub-circuit and the eighth memristor is programmed to set an open-ended upper boundary threshold voltage ($V_{4TH=\text{"wildcard"}}$) for the fourth aCAM sub-circuit such that the fourth aCAM sub-circuit returns a match along the match line for any value of the fourth analog voltage signal ($V(x-PL_{1/2/3})$).

12. A circuit comprising:
a controller;
a first digital-to-analog converter electrically connected to the controller and a first aCAM sub-circuit;
a second digital-to-analog converter electrically connected to the controller and a second aCAM sub-circuit;
the first aCAM sub-circuit electrically connected to the first digital-to-analog converter and a match line; and
the second aCAM sub-circuit electrically connected to the second digital-to-analog converter and the match line;
wherein, upon receiving a digital input signal (x):
the controller transmits the digital input signal (x) to the first digital-to-analog converter and transmits a reduced digital input signal ($x-PL_1$) to the second digital-to-analog converter, the reduced digital input signal ($x-PL_1$) comprising a version of the digital input signal (x) reduced according to a number of programmable levels for the first aCAM sub-circuit;
the first digital-to-analog converter converts the digital input signal (x) into a first analog voltage signal ($V(x)$) representing the digital input signal (x) and transmits the first analog voltage signal ($V(x)$) to the first aCAM sub-circuit;
the second digital-to-analog converter converts the reduced digital input signal ($x-PL_1$) into a second analog voltage signal ($V(x-PL_1)$) representing the reduced digital input signal ($x-PL_1$) and transmits the second analog voltage signal ($V(x-PL_1)$) to the second aCAM sub-circuit,
the circuit returns a match when the first analog voltage signal ($V(x)$) is within a programmed voltage range of the first aCAM sub-circuit and the second analog voltage signal ($V(x-PL_1)$) is within a programmed voltage range of the second aCAM sub-circuit.

13. The circuit of claim 12, wherein:
the first aCAM sub-circuit comprises a first memristor and a second memristor;
the second aCAM sub-circuit comprises a third memristor and a fourth memristor; and
the first-fourth memristors each have (M) programmable bits, the (M) programmable bits of a given memristor programmed by tuning conductance of the given memristor.

14. The circuit of claim 13, wherein the circuit comprises at least $2*2^M$ programmable levels for representationally storing an analog voltage range across at least the first and second aCAM sub-circuits.

15. The circuit of claim 13, an analog voltage range representationally stored across at least the first and second aCAM sub-circuits represents an entry of a word.

16. A circuit comprising:
a digital-to-analog converter electrically connected to a first aCAM sub-circuit and a first subtractor sub-circuit;
the first subtractor sub-circuit electrically connected to the digital-to-analog converter and a second aCAM sub-circuit;
the first aCAM sub-circuit electrically connected to the digital-to-analog converter and a match line; and
the second aCAM sub-circuit electrically connected to the first subtractor sub-circuit and the match line;
wherein, upon receiving a digital input signal (x):
the digital-to-analog converter:
converts the digital input signal (x) into a first analog voltage signal ($V(x)$) representing the digital input signal (x), and
transmits the first analog voltage signal ($V(x)$) to the first aCAM sub-circuit and the first subtractor sub-circuit;
the first subtractor sub-circuit:
converts the first analog voltage signal ($V(x)$) into a second analog voltage signal ($V(x-PL_1)$) representing a version of the digital input signal (x) reduced according to a number of programmable levels for the first aCAM sub-circuit, and
transmits the second analog voltage signal ($V(x-PL_1)$) to the second aCAM sub-circuit, and
the circuit returns a match when the first analog voltage signal ($V(x)$) is within a programmed voltage range of the first aCAM sub-circuit and the second analog voltage signal ($V(x-PL_1)$) is within a programmed voltage range of the second aCAM sub-circuit.

17. The circuit of claim 16, further comprising:
a second subtractor sub-circuit electrically connected to the first subtractor sub-circuit, a third subtractor sub-circuit, and a third aCAM sub-circuit;
third second subtractor sub-circuit electrically connected to the second subtractor sub-circuit and a fourth aCAM sub-circuit;
the third aCAM sub-circuit electrically connected to the second subtractor sub-circuit and the match line; and
the fourth aCAM sub-circuit electrically connected to the third subtractor sub-circuit and the match line;
wherein, upon receiving the digital input signal (x):
the first subtractor sub-circuit:
converts the first analog voltage signal ($V(x)$) into the second analog voltage signal ($V(x-PL_1)$) representing the version of the digital input signal (x) reduced according to the number of programmable levels for the first aCAM sub-circuit, and
transmits the second analog voltage signal ($V(x-PL_1)$) to the second aCAM sub-circuit and the second subtractor sub-circuit,
the second subtractor sub-circuit:
converts the second analog voltage signal ($V(x-PL_1)$) into a third analog voltage signal ($V(x-PL_{1/2})$) representing a version of the digital input signal (x) reduced according to an aggregated number of programmable levels for the first and second aCAM sub-circuits, and
transmits the third analog voltage signal $V(x-PL_{1/2})$ to the third aCAM sub-circuit and the third subtractor sub-circuit,
the third subtractor sub-circuit:
converts the third analog voltage signal ($V(x-PL_{1/2})$) into a fourth analog voltage signal ($V(x-PL_{1/2/3})$) representing a version of the digital input signal (x) reduced according to an aggregated number of programmable levels for the first-third aCAM sub-circuits, and
transmits the fourth analog voltage signal ($V(x-PL_{1/2/3})$) to the fourth aCAM sub-circuit, and
the circuit only returns a match when the first analog voltage signal ($V(x)$) is within a programmed voltage range of the first aCAM sub-circuit and the second analog voltage signal ($V(x-PL_1)$) is within a programmed voltage range of the second aCAM sub-circuit and the third analog voltage signal ($V(x-PL_{1/2})$)

is within a programmed voltage range of the third aCAM sub-circuit and the fourth analog voltage signal (V(x-PL$_{1/2/3}$)) is within a programmed voltage range of the fourth aCAM sub-circuit.

18. The circuit of claim 17, wherein:
the first aCAM sub-circuit comprises a first memristor and a second memristor;
the second aCAM sub-circuit comprises a third memristor and a fourth memristor;
the third aCAM sub-circuit comprises a fifth memristor and a sixth memristor;
the fourth aCAM sub-circuit comprises a seventh memristor and an eighth memristor; and
the first-eighth memristors each have (M) programmable bits, the (M) programmable bits of a given memristor programmed by tuning conductance of the given memristor.

19. The circuit of claim 18, wherein the circuit comprises at least 4*2$^M$ programmable levels for representationally storing an analog voltage range across at least two of the first-fourth aCAM sub-circuits.

20. The circuit of claim 18, wherein an analog voltage range representationally stored across at least two of the first-fourth aCAM sub-circuits represents an entry of a word.

* * * * *